United States Patent
Yamamoto et al.

(10) Patent No.: US 10,916,276 B2
(45) Date of Patent: Feb. 9, 2021

(54) NONVOLATILE MEMORY AND MEMORY SYSTEM

(71) Applicant: TOSHIBA MEMORY CORPORATION, Tokyo (JP)

(72) Inventors: Kensuke Yamamoto, Kanagawa (JP);
Kosuke Yanagidaira, Kanagawa (JP);
Fumiya Watanabe, Kanagawa (JP);
Shouichi Ozaki, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 113 days.

(21) Appl. No.: 16/280,323

(22) Filed: Feb. 20, 2019

(65) Prior Publication Data

US 2020/0089630 A1    Mar. 19, 2020

(30) Foreign Application Priority Data

Sep. 19, 2018  (JP) .................................. 2018-174423

(51) Int. Cl.

| | | |
|---|---|---|
| *G11C 7/22* | (2006.01) | |
| *G06F 13/16* | (2006.01) | |
| *G06F 13/42* | (2006.01) | |
| *G06F 1/10* | (2006.01) | |
| *G11C 7/04* | (2006.01) | |
| *G11C 7/10* | (2006.01) | |
| *G11C 29/02* | (2006.01) | |
| *G11C 7/20* | (2006.01) | |
| *G11C 29/44* | (2006.01) | |

(52) U.S. Cl.
CPC .................. *G11C 7/22* (2013.01); *G06F 1/10* (2013.01); *G06F 13/1689* (2013.01); *G06F 13/4243* (2013.01); *G11C 7/04* (2013.01); *G11C 7/1066* (2013.01); *G11C 7/20* (2013.01); *G11C 7/222* (2013.01); *G11C 29/028* (2013.01); *G11C 2029/4402* (2013.01); *G11C 2207/2254* (2013.01)

(58) Field of Classification Search
CPC ......... G11C 7/222; G11C 7/04; G11C 7/1066; G11C 2207/2254; G11C 16/0483; G11C 16/30; G11C 11/40; G11C 11/409; G11C 29/028; G11C 2029/4402; G11C 7/20; G06F 13/1689; G06F 13/4243; G06F 1/10
See application file for complete search history.

(56) References Cited

U.S. PATENT DOCUMENTS

| | | | | |
|---|---|---|---|---|
| 6,965,537 B1 * | 11/2005 | Klein | ..................... | G06F 11/106 365/200 |
| 7,694,196 B2 * | 4/2010 | Schnell | .................. | G11C 29/44 714/723 |
| 8,081,527 B1 | 12/2011 | Venkataraman et al. | | |

(Continued)

*Primary Examiner* — Ajay Ohja
(74) *Attorney, Agent, or Firm* — Holtz, Holtz & Volek PC

(57) ABSTRACT

According to one embodiment, a nonvolatile memory includes a memory cell array including a first storage region and a second storage region, an input/output circuit configured to communicate with a memory controller, and a control circuit. The control circuit is configured to, upon receiving a first command from the memory controller, execute a first training operation related to the input/output circuit, and upon receiving a second command from the memory controller, store a first result of the first training operation in the first storage region.

19 Claims, 21 Drawing Sheets

(56) References Cited

U.S. PATENT DOCUMENTS

| | | |
|---|---|---|
| 8,897,083 B1 | 11/2014 | Azizi et al. |
| 10,262,708 B2 * | 4/2019 | Jeong .................. G11C 29/028 |
| 2012/0087194 A1 | 4/2012 | Oh et al. |
| 2012/0221776 A1 * | 8/2012 | Yoshihashi ......... G06F 12/0246 |
| | | 711/103 |
| 2017/0323222 A1 | 11/2017 | Rao et al. |
| 2017/0371560 A1 | 12/2017 | Macgarry et al. |
| 2018/0004688 A1 | 1/2018 | Chung et al. |

* cited by examiner

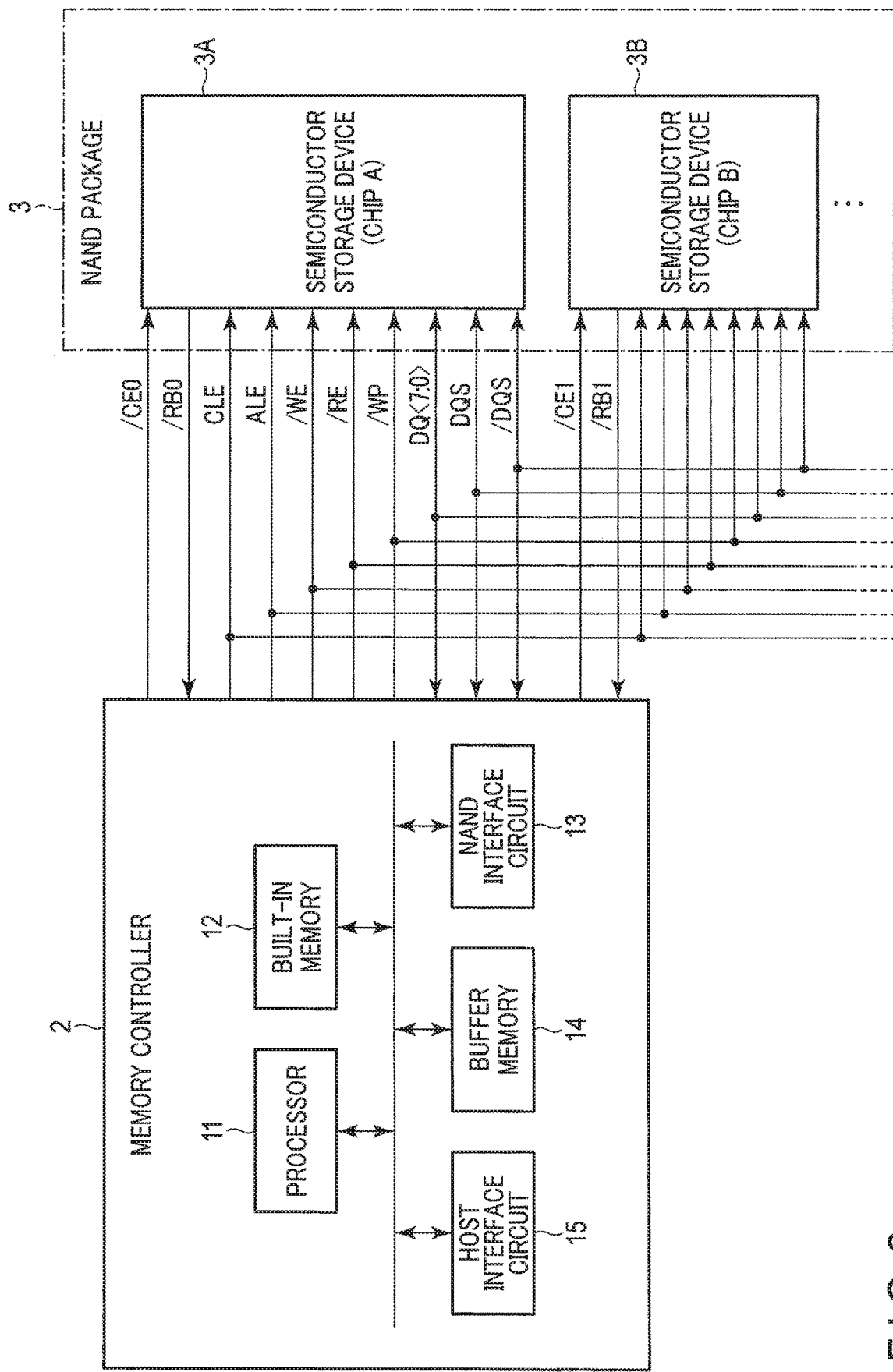
F I G. 2

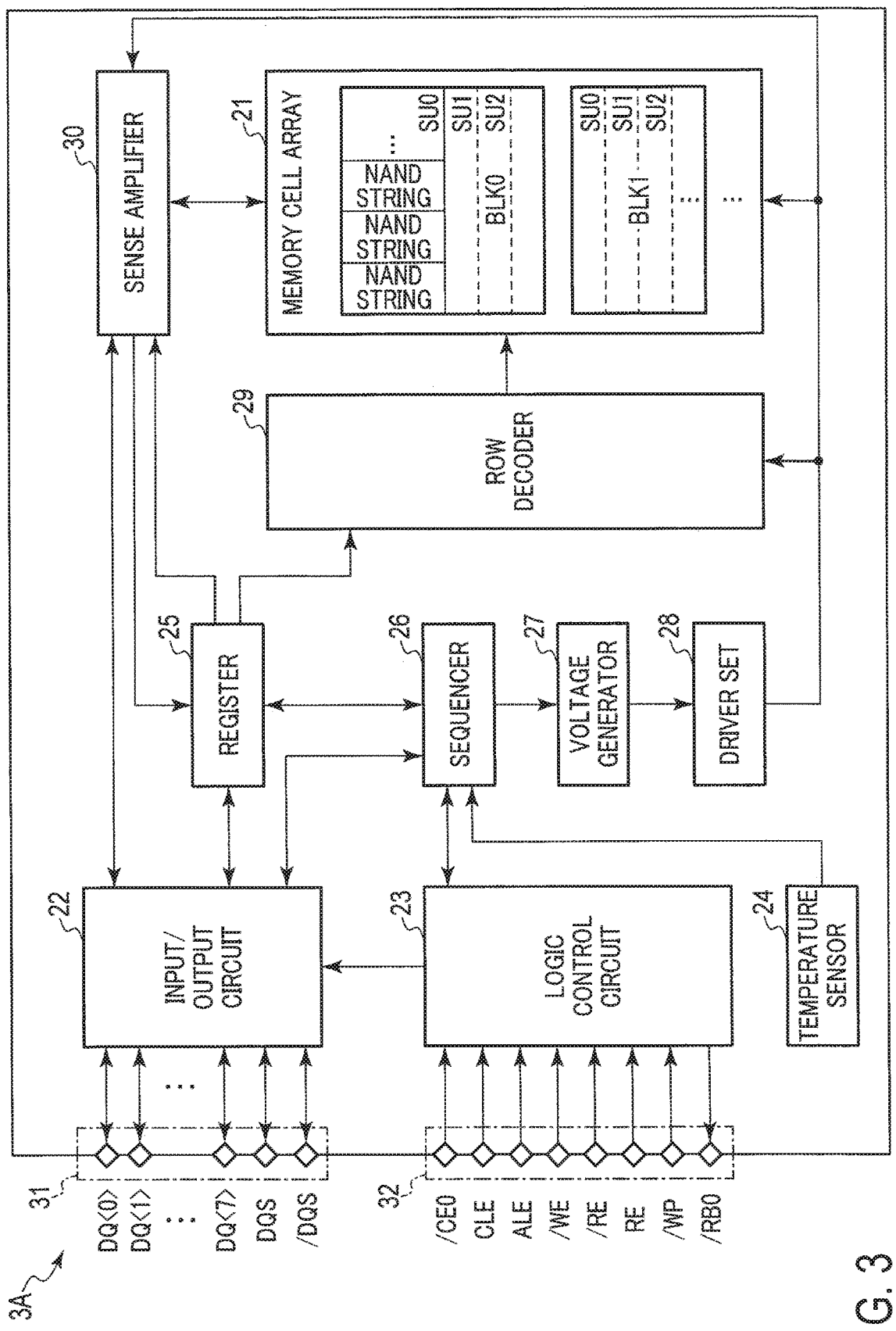
F I G. 3

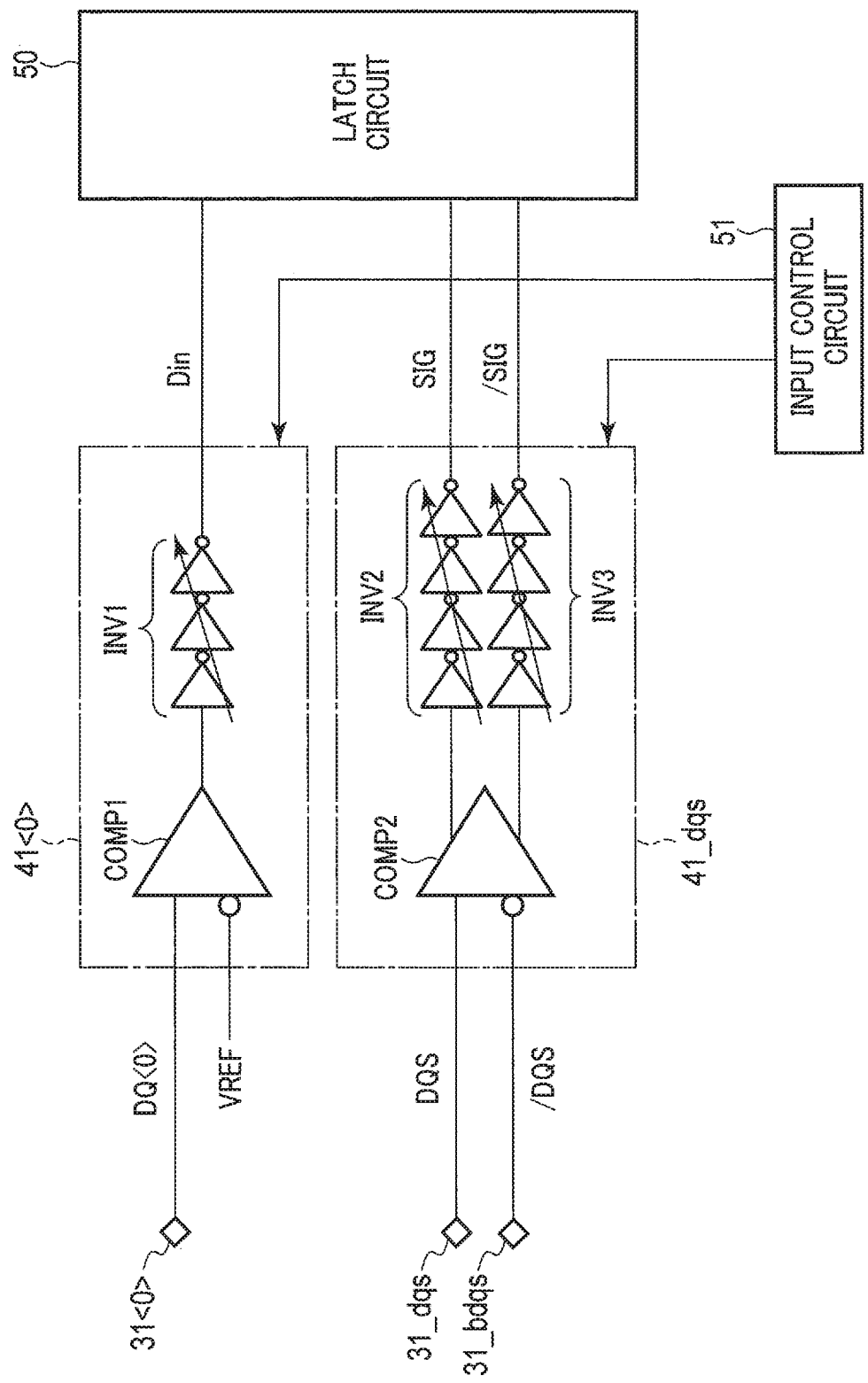
F I G. 7

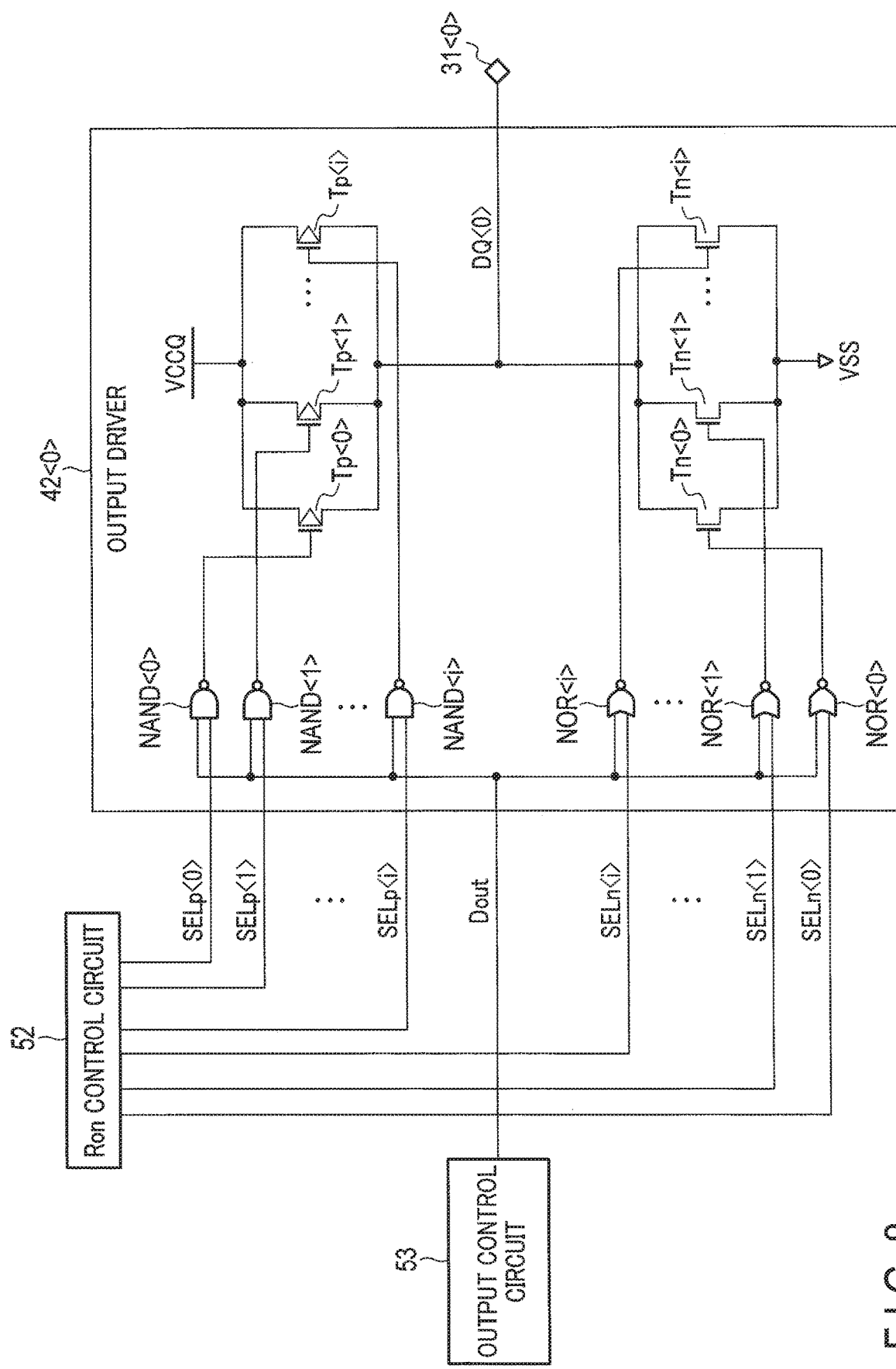
F I G. 8

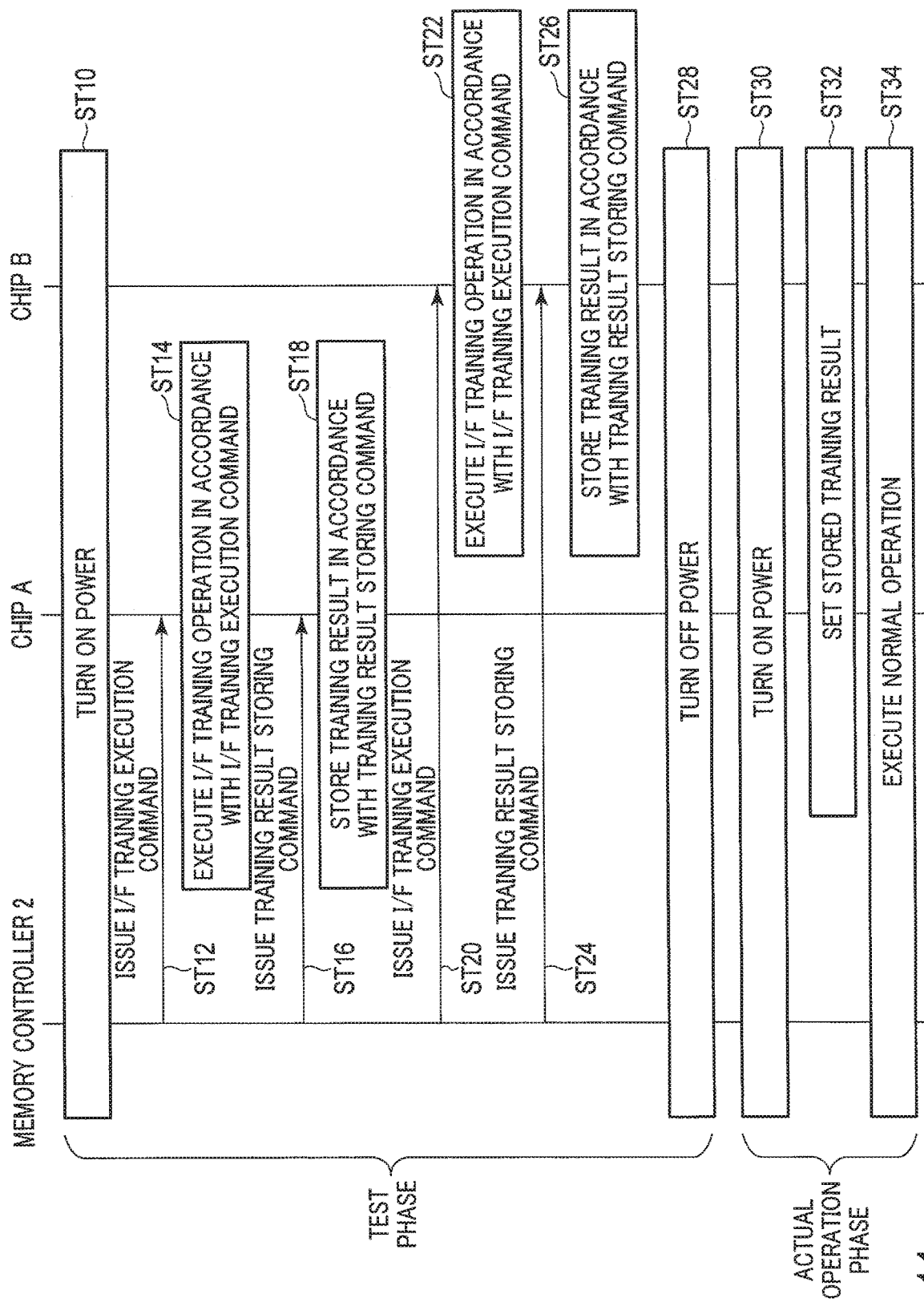
F I G. 11

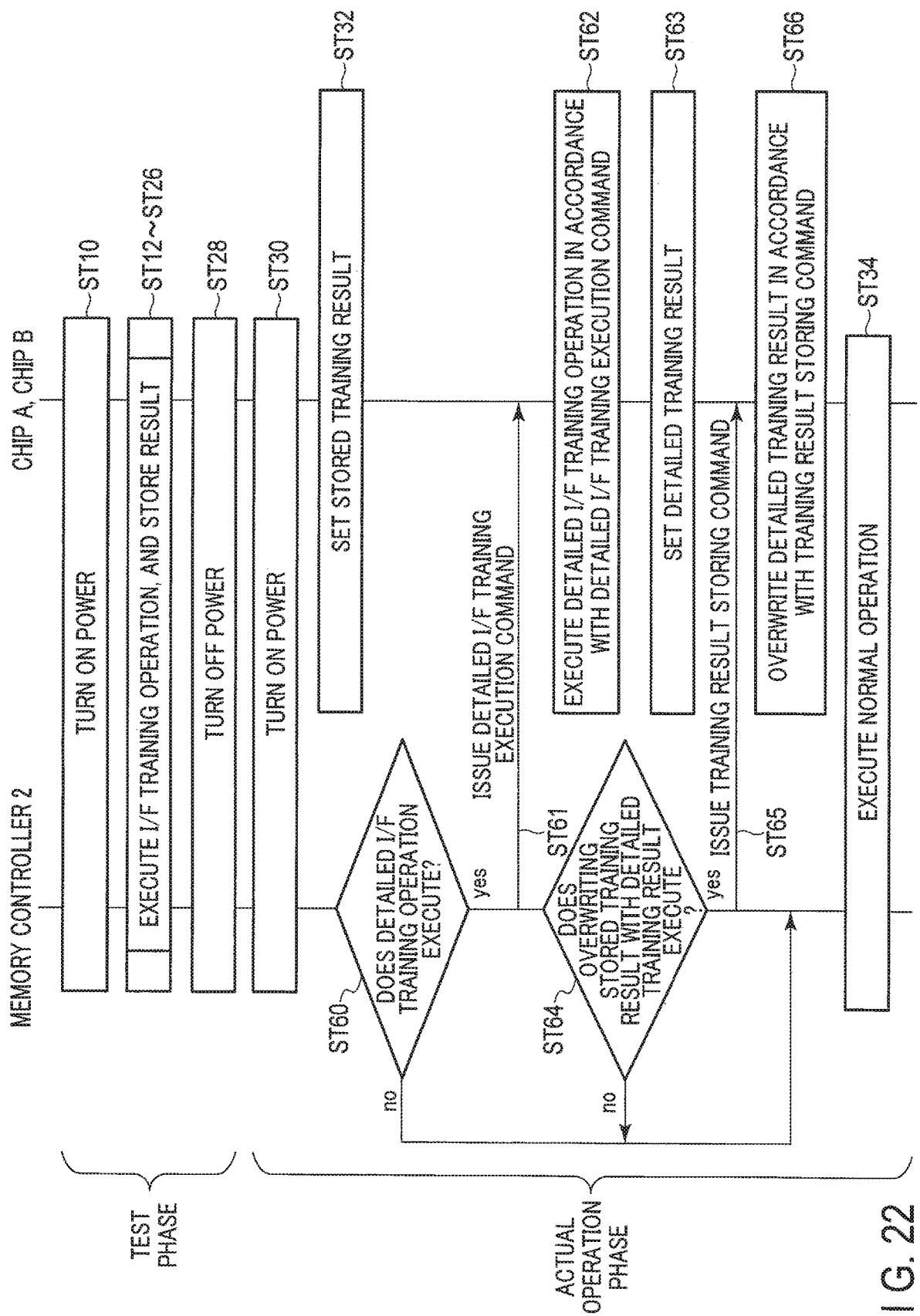
F I G. 22

NONVOLATILE MEMORY AND MEMORY SYSTEM

CROSS-REFERENCE TO RELATED APPLICATIONS

This application is based upon and claims the benefit of priority from Japanese Patent Application No. 2018-174423, filed Sep. 19, 2018, the entire contents of which are incorporated herein by reference.

FIELD

Embodiments described herein relate generally to a nonvolatile memory and a memory system.

BACKGROUND

A memory system is known including a NAND type flash memory as a nonvolatile memory and a memory controller for controlling the NAND type flash memory.

BRIEF DESCRIPTION OF THE DRAWINGS

FIG. 2 is a block diagram for explaining a configuration of a signal system of the memory system according to the first embodiment;

FIG. 3 is a block diagram for explaining a configuration of a semiconductor storage device according to the first embodiment;

FIG. 7 is a circuit diagram for explaining a configuration of an input circuit of the semiconductor storage device according to the first embodiment;

FIG. 8 is a circuit diagram for explaining a configuration of an output circuit of the semiconductor storage device according to the first embodiment;

FIG. 11 is a flowchart for explaining a series of operations including the interface training operation in the memory system according to the first embodiment;

FIG. 22 is a flowchart for explaining a series of operations including a detailed interface training operation in a memory system according to a seventh embodiment.

DETAILED DESCRIPTION

Figure 1:
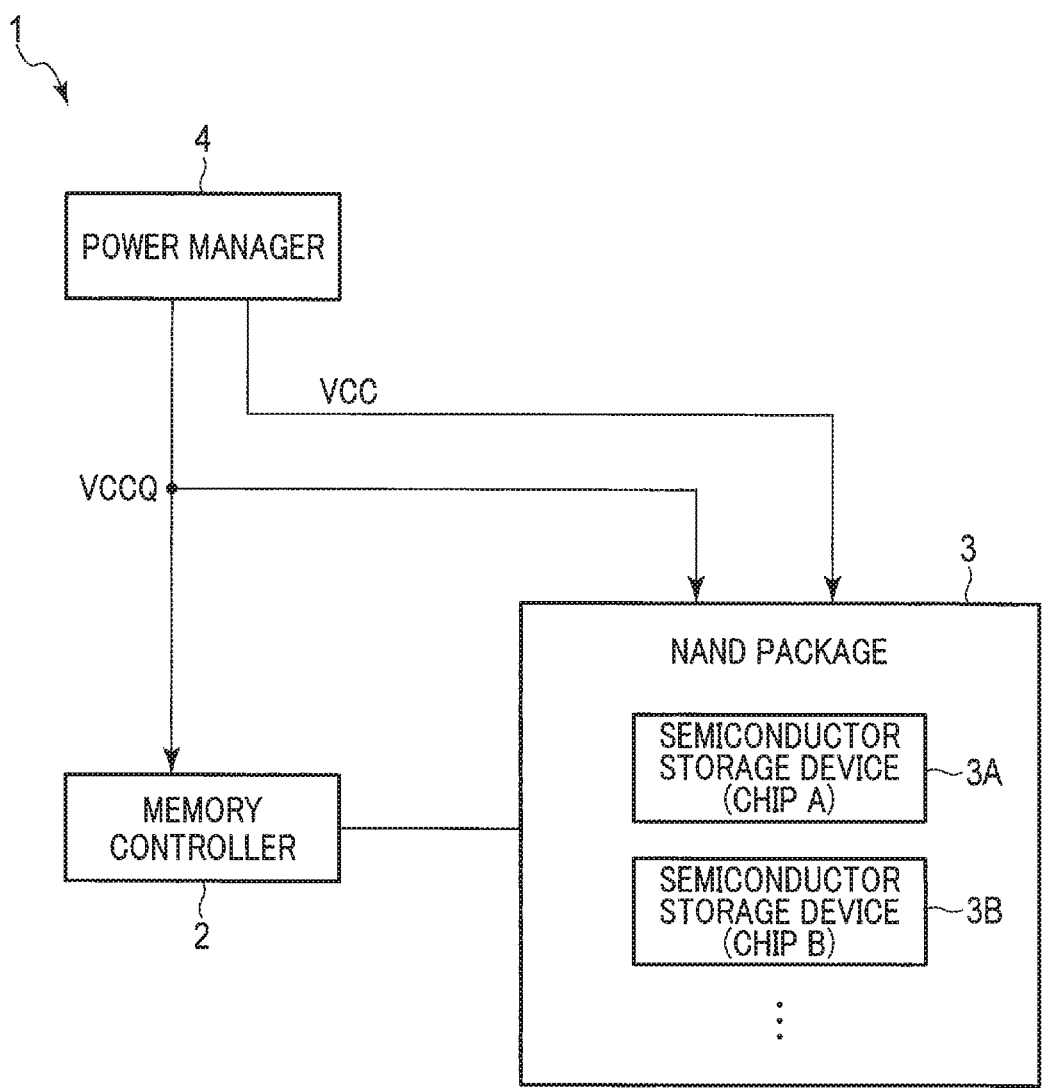
FIG. 1 is a block diagram for explaining a configuration of a power supply system of a memory system according to a first embodiment.

In general, according to one embodiment, a nonvolatile memory includes a memory cell array including a first storage region and a second storage region, an input/output circuit configured to communicate with a memory controller, and a control circuit. The control circuit is configured to, upon receiving a first command from the memory controller, execute a first training operation related to the input/output circuit, and upon receiving a second command from the memory controller, store a first result of the first training operation in the first storage region.

Hereinafter, embodiments is described with reference to the drawings. Note that, in the following description, constituent components having the equivalent functions and configurations are denoted by the same reference numerals.

In the following description, a signal X<n:0> (n is a natural number) is an (n+1)-bit signal, and means a set of signals X<0>, X<1>, . . . , and X<n>, each of which is a 1-bit signal. A constituent component Y<n:0> means a set of constituent components Y<0>, Y<1>, . . . , and Y<n> corresponding one-to-one to inputs or outputs of the signal X<n:0>.

In the following description, a "duty ratio of a signal Z" indicates a ratio of the time from the rise to fall of a pulse with respect to one period of the pulse in the signal Z. A signal /Z indicates an inverted signal of the signal Z.

1. First Embodiment

A memory system according to a first embodiment is described. The memory system according to the first embodiment includes, for example, a NAND type flash memory as a nonvolatile memory (semiconductor storage device), and a memory controller for controlling the NAND type flash memory.

1.1 Configuration

1.1.1 Overall Configuration of Memory System

An overall configuration of the memory system according to the first embodiment is described with reference to FIGS. 1 and 2. A memory system 1 communicates with, for example, an external host device (not illustrated). The memory system 1 holds data from the host device and reads the data to the host device.

FIG. 1 is a block diagram for explaining a power supply system of the memory system according to the first embodiment. As illustrated in FIG. 1, the memory system 1 includes a memory controller 2, a NAND package 3, and a power manager 4. The NAND package 3 includes a plurality of semiconductor storage devices 3A, 3B, . . . , for example. Since each of the semiconductor storage devices 3A, 3B, . . . has, for example, an equivalent configuration, the semiconductor storage devices 3A and 3B are described among the semiconductor storage devices 3A, 3B, . . . , in the following description. The semiconductor storage devices 3A and 3B may be read as a chip A and a chip B, respectively.

The power manager 4 is an integrated circuit (IC) for managing voltages supplied to the memory controller 2 and the NAND package 3. The power manager 4 supplies, for example, a voltage VCCQ to the memory controller 2 and the NAND package 3. The voltage VCCQ is used as a reference voltage of input/output signals communicated between the memory controller 2 and the NAND package 3. In addition, the power manager 4 supplies, for example, a voltage VCC to the NAND package 3. The voltage VCC is used as a reference voltage used in the NAND package 3.

FIG. 2 is a block diagram for explaining a signal system of the memory system according to the first embodiment. As illustrated in FIG. 2, the memory controller 2 controls the semiconductor storage devices 3A and 3B. Specifically, the memory controller 2 writes data to the semiconductor storage devices 3A and 3B, and reads data from the semiconductor storage devices 3A and 3B. The memory controller 2 is connected to the semiconductor storage devices 3A and 3B by a NAND bus.

Each of the semiconductor storage devices 3A and 3B includes a plurality of memory cells and stores data in a nonvolatile manner. Each of the semiconductor storage devices 3A and 3B is, for example, a semiconductor chip that can be uniquely identified when a chip address is assigned in advance, and is configured to be independently operable by an instruction of the memory controller 2.

The same type signals are transmitted and received on the NAND bus connected to each of the semiconductor storage devices 3A and 3B. The NAND bus includes a plurality of signal lines, and transmits and receives signals /CE0 and /CE1, CLE, ALE, /WE, /RE, /WP, /RB0 and /RB1, DQ<7:0>, DQS, and /DQS according to a NAND interface. The signals CLE, ALE, /WE, /RE, and /WP are received by the semiconductor storage devices 3A and 3B, and the signals /RB0 and /RB1 are received by the memory controller 2. In addition, the signals /CE0 and /CE1 are received by the semiconductor storage devices 3A and 3B, respectively.

The signals /CE0 and /CE1 are signals for enabling the semiconductor storage devices 3A and 3B, respectively. The signal CLE notifies the semiconductor storage devices 3A and 3B that the signal DQ<7:0> is a command flowing to the semiconductor storage devices 3A and 3B while the signal CLE is at a "High (H)" level. The signal ALE notifies the semiconductor storage devices 3A and 3B that the signal DQ<7:0> is an address flowing to the semiconductor storage devices 3A and 3B while the signal ALE is at the "H" level. The signal /WE instructs the semiconductor storage devices 3A and 3B to take in the signal DQ<7:0> flowing to the semiconductor storage devices 3A and 3B while the signal /WE is at a "Low (L)" level. The signal /RE instructs the semiconductor storage devices 3A and 3B to output the signal DQ<7:0>, and is used for controlling an operation timing of the semiconductor storage devices 3A and 3B when the signal DQ<7:0> is output, for example. The signal /WP instructs the semiconductor storage devices 3A and 3B to inhibit data write and data erase. The signals /RB0 and /RB1 respectively indicate whether the semiconductor storage devices 3A and 3B are in a ready state (a state in which an instruction from the outside is accepted) or a busy state (a state in which an instruction from the outside is not accepted). The signal DQ<7:0> is, for example, an 8-bit signal. The signal DQ<7:0> is an entity of data transmitted and received between the memory controller 2 and the semiconductor storage devices 3A and 3B, and includes a command, an address, and data. The signals DQS and /DQS are used for controlling an operation timing of the semiconductor storage devices 3A and 3B related to the signal DQ<7:0>, for example.

1.1.2 Configuration of Controller

Subsequently, with reference to FIG. 2, a controller is described of the memory system according to the first embodiment. The memory controller 2 includes a processor (central processing unit (CPU)) 11, a built-in memory (random access memory (RAM)) 12, a NAND interface circuit 13, a buffer memory 14, and a host interface circuit 15.

The processor 11 controls overall operation of the memory controller 2. For example, the processor 11 issues a write command based on the NAND interface to the semiconductor storage devices 3A and 3B in response to a data write instruction received from the outside. This operation also applies to other operations such as a read operation, an erase operation, and a calibration operation.

The built-in memory 12 is, for example, a semiconductor memory such as a dynamic RAM (DRAM), and is used as a work area of the processor 11. The built-in memory 12 holds firmware, various management tables, and the like for managing the semiconductor storage devices 3A and 3B.

The NAND interface circuit 13 is connected to the semiconductor storage devices 3A and 3B via the above-described NAND bus, and controls communication with the semiconductor storage devices 3A and 3B. The NAND interface circuit 13 transmits a command, an address, and write data to the semiconductor storage devices 3A and 3B in accordance with an instruction from the processor 11. In addition, the NAND interface circuit 13 receives status and read data from the semiconductor storage devices 3A and 3B.

The buffer memory 14 temporarily holds data and the like received by the memory controller 2 from the semiconductor storage devices 3A and 3B, and the external device.

The host interface circuit 15 is connected to an external host device (not illustrated) and controls communication with the host device. The host interface circuit 15 transfers, for example, an instruction and data received from the host device to the processor 11 and the buffer memory 14, respectively.

1.1.3 Configuration of Semiconductor Storage Device

Next, an example of a configuration of the semiconductor storage device according to the first embodiment is described with reference to FIG. 3. Note that, as described above, the semiconductor storage devices 3A, 3B, . . . have, for example, equivalent configurations. For this reason, a configuration of the semiconductor storage device 3A among the semiconductor storage devices 3A, 3B, . . . , is described and descriptions are omitted of configurations of the other semiconductor storage devices 3B, . . . , in the following description.

As illustrated in FIG. 3, the semiconductor storage device 3A includes a memory cell array 21, an input/output circuit 22, a logic control circuit 23, a temperature sensor 24, a register 25, a sequencer 26, a voltage generator 27, a driver set 28, a row decoder 29, a sense amplifier 30, an input/output pad group 31, and a logic control pad group 32.

The memory cell array 21 includes a plurality of blocks BLK (BLK0, BLK1, . . . ). The blocks BLK each include a plurality of nonvolatile memory cell transistors (not illustrated) associated with word lines and bit lines. The blocks BLK each are, for example, an erase unit of data, and the data in the same block BLK is erased collectively. Each of the blocks BLK includes a plurality of string units SU (SU0, SU1, . . . ). Each of the string units SU includes a plurality of NAND strings NS. Note that, the number of blocks in the memory cell array 21, the number of string units in one of the blocks BLK, and the number of the NAND strings in one of the string units SU may be set to arbitrary numbers.

The input/output circuit 22 transmits/receives the signal DQ<7:0>, DQS, and /DQS to/from the memory controller 2. The input/output circuit 22 transfers a command and an address in the signal DQ<7:0> to the register 25. The input/output circuit 22 transmits/receives write data and read data to/from the sense amplifier 30.

The logic control circuit 23 receives the signals /CE0, CLE, ALE, /WE, /RE, RE, and /WP from the memory controller 2. In addition, the logic control circuit 23 transfers the signal /RB0 to the memory controller 2 to notify the outside of a state of the semiconductor storage device 3A.

The temperature sensor 24 has a function capable of measuring a temperature in the semiconductor storage device 3A. The temperature sensor 24 sends information on the measured temperature to the sequencer 26. Note that, the temperature sensor 24 can be provided at any place in the semiconductor storage device 3A within a range in which a temperature is measured that can be regarded as a temperature of the memory cell array 21.

The register 25 holds commands and addresses. The register 25 transfers the addresses to the row decoder 29 and the sense amplifier 30, and transfers the commands to the sequencer 26.

The sequencer 26 receives the command and controls the entire semiconductor storage device 3A in accordance with a sequence based on the received command. In addition, the sequencer 26 sends the information on the temperature received from the temperature sensor 24 to the memory controller 2 via the input/output circuit 22.

The voltage generator 27 generates voltages necessary for operations such as data write operation, data read operation, and data erase operation and the like, based on instructions from the sequencer 26. The voltage generator 27 supplies the generated voltages to the driver set 28.

The driver set 28 includes a plurality of drivers, and supplies various voltages from the voltage generator 27 to the row decoder 29 and the sense amplifier 30, based on the address from the register 25. The driver set 28 supplies the various voltages to the row decoder 29, for example, based on a row address in the address.

The row decoder 29 receives the row address in the address from the register 25, and selects memory cells of a row based on the row address. Then, the voltages from the driver set 28 are transferred to the memory cells of the selected row via the row decoder 29.

During data read, the sense amplifier 30 senses the voltage of the bit lines, and reads out data to the input/output circuit 22. During data write operation, the sense amplifier 30 transfers to the memory cell the write data to be written via the bit lines. In addition, the sense amplifier 30 receives a column address in the address from the register 25, and outputs data from the memory cells corresponding to a column based on the column address.

The input/output pad group 31 transfers the signals DQ<7:0>, DQS, and /DQS received from the memory controller 2 to the input/output circuit 22. In addition, the input/output pad group 31 transfers the signal DQ<7:0> transmitted from the input/output circuit 22 to the outside of the semiconductor storage device 3A.

The logic control pad group 32 transfers the signals /CE0, CLE, ALE, /WE, /RE, RE, and /WP received from the memory controller 2 to the logic control circuit 23. In addition, the logic control pad group 32 transfers /RB0 transmitted from the logic control circuit 23 to the outside of the semiconductor storage device 3A.

1.1.4 Configuration of Memory Cell Array

Figure 4:
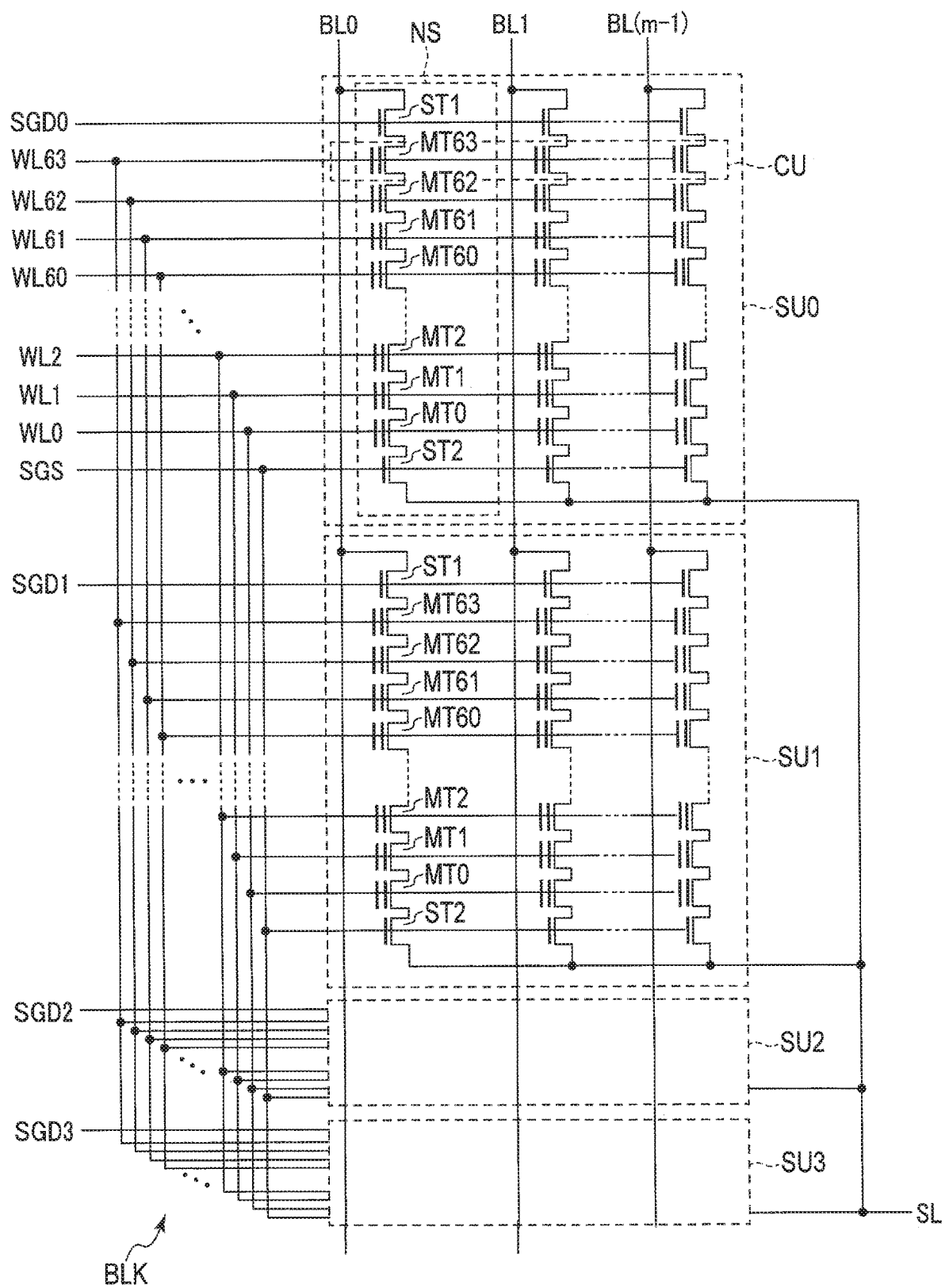
FIG. 4 is a circuit diagram for explaining a configuration of a memory cell array of the semiconductor storage device according to the first embodiment.

Next, a configuration of the memory cell array of the semiconductor storage device according to the first embodiment is described. FIG. 4 is an example of a circuit diagram for explaining the configuration of the memory cell array of the semiconductor storage device according to the first embodiment. In FIG. 4, a circuit diagram is illustrated of one of the blocks BLK in the memory cell array 21.

As illustrated in FIG. 4, each of the string units SU includes a set of the NAND strings NS. Each of the NAND strings NS includes, for example, 64 memory cell transistors MT (MT0 to MT63), a selection transistor ST1, and a selection transistor ST2. Note that, the number of the memory cell transistors MT included in one of the NAND strings NS is not limited to 64, but may be 8, 16, 32, 96, 128, and the like, and the number is not limited. The memory cell transistors MT each include a stacked gate including a control gate and a charge storage layer. The memory cell transistors MT are connected in series between the selection transistors ST1 and ST2. Note that, in the following description, the term "connection" may also include a case where another electrically conductive element is interposed therebetween.

In a block BLK, gates of the selection transistors ST1 of each of the string units SU0 to SU3 are connected to selection gate lines SGD0 to SGD3, respectively. In addition, gates of the selection transistors ST2 of all the string units SU in the block BLK are commonly connected to a selection gate line SGS. Control gates of each of the memory cell transistors MT0 to MT7 in the same block BLK are connected to the word lines WL0 to WL7, respectively. That is, memory cell transistors MT corresponding to an address in all string units SU in a block BLK are commonly connected a word line WL corresponding to the address. The selection gate line SGS is commonly connected to all the string units SU in the same block BLK. On the other hand, the selection gate lines SGD each are connected to only one of the string units SU in the same block BLK.

Among the NAND strings NS arranged in a matrix in the memory cell array 21, one ends of the NAND strings NS (the selection transistors ST1) in the same row are respectively connected to any of m bit lines BL (BL0 to BL(m−1) (m is a natural number)). In addition, the bit lines BL are commonly connected to the NAND strings NS of the same column over the blocks BLK.

Another ends of the NAND strings NS (the selection transistors ST2) in the same row are commonly connected to a source line SL. The source line SL is commonly connected to the NAND strings NS over the blocks BLK.

As described above, erasing of data is performed collectively for the memory cell transistors MT in the same block BLK, for example. On the other hand, a read operation and a write operation of data are performed collectively for the memory cell transistors MT commonly connected to any of the word lines WL in any of the string units SU of any of the blocks BLK. Such a set of the memory cell transistors MT sharing the word lines WL in one of the string units SU is referred to as a cell unit CU, for example. In other words, the cell unit CU is a set of the memory cell transistors MT to which the write operation or the read operation can be collectively executed.

One of the memory cell transistors MT can hold a plurality of bit data, for example. In the same cell unit CU, a set of 1-bit data held by the memory cell transistors MT at the same order is called a "page". In other words, the "page" can also be defined as a part of a memory space formed in a set of the memory cell transistors MT in the same cell unit CU.

Figure 5:
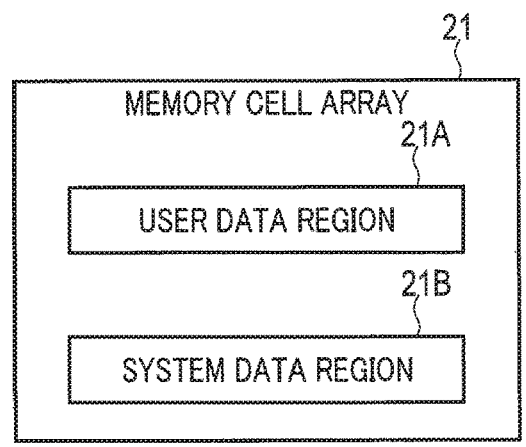
FIG. 5 is a block diagram for explaining a storage region of the memory cell array of the semiconductor storage device according to the first embodiment.

FIG. 5 is a block diagram for explaining an example of a storage region of the memory cell array of the semiconductor storage device according to the first embodiment.

As illustrated in FIG. 5, the memory cell array 21 includes a user data region 21A and a system data region 21B.

The user data region 21A is a storage region including the memory cell transistors MT for storing user data input from the memory controller 2, for example. That is, the user data region 21A indicates an area freely accessible by a user, and is an area in which data can be written and read by a general write command and a general read command.

The system data region 21B is a storage region including the memory cell transistors MT for storing various set values (system data) necessary for operations of the semiconductor storage device 3A, for example. Unlike the user data region 21A, for the system data region 21B, the write operation using the general write command issued during a normal operation is inhibited. For the write operation to the system data region 21B, a dedicated command is required different from the general write command.

1.1.5 Configuration of Input/Output Circuit

Next, a configuration of an input/output circuit of the semiconductor storage device according to the first embodiment is described.

1.1.5.1 Overall Configuration of Input/Output Circuit

Figure 6:
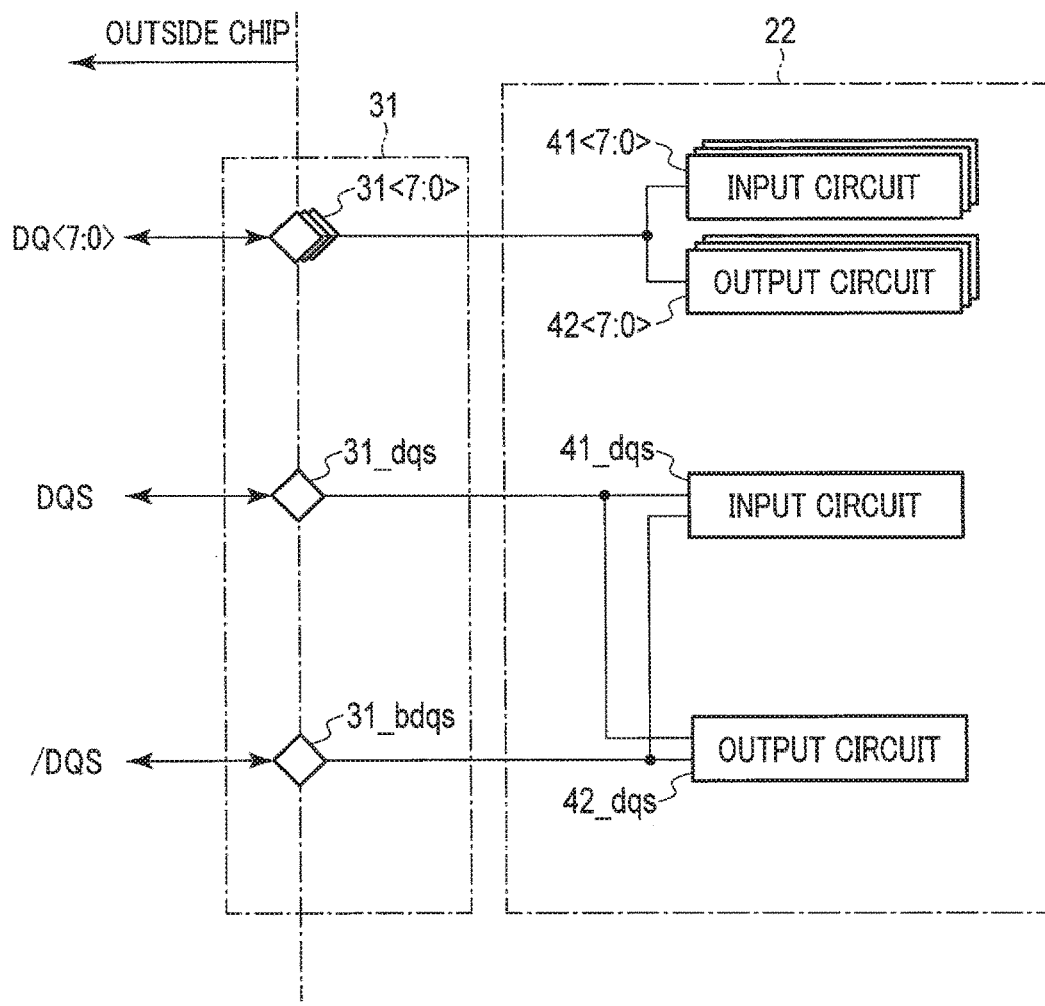
FIG. 6 is a block diagram for explaining a configuration of an input/output circuit of the semiconductor storage device according to the first embodiment.

First, an overall configuration of the input/output circuit of the semiconductor storage device according to the first embodiment is described. FIG. 6 is a block diagram for explaining the configuration of the input/output circuit of the semiconductor storage device according to the first embodiment.

As illustrated in FIG. 6, the input/output circuit 22 includes a set of input circuits 41<7:0> and output circuits 42<7:0> corresponding to the signal DQ<7:0>. For example, the same type signal DQ<j> (0≤j≤7) is assigned to a set of an input circuit 41<j> and an output circuit 42<j>. That is, the set of the input circuit 41<j> and the output circuit 42<j> can communicate the signal DQ<j> with the external memory controller 2 via a pad 31<j> in the input/output pad group 31.

The input/output circuit 22 includes a set of an input circuit 41_dqs and an output circuit 42_dqs corresponding to a set of the signals DQS and /DQS. That is, the set of the input circuit 41_dqs and the output circuit 42_dqs can communicate the signals DQS and /DQS with the external memory controller 2 via pads 31_dqs and 31_bdqs in the input/output pad group 31.

1.1.5.2 Configuration of Input Circuit

Next, a configuration of an input circuit in the input/output circuit according to the first embodiment is described with reference to FIG. 7. FIG. 7 is a circuit diagram for explaining the configuration of the input circuit of the semiconductor storage device according to the first embodiment. FIG. 7 illustrates examples of a connection relationship between the pad 31<0> and the input circuit 41<0> corresponding to the pad 31<0>, and a connection relationship between the pads 31_dqs and 31_bdqs, and the input circuit 41_dqs corresponding to the pads 31_dqs and 31_bdqs. Note that, since configurations of the other input circuits 41<7:1> are equivalent to the configuration of the input circuit 41<0>, the description thereof is omitted.

As illustrated in FIG. 7, the input circuit 41<0> includes a comparator COMP1 and an inverter group INV1. The input circuit 41_dqs includes a comparator COMP2 and inverter groups INV2 and INV3.

The comparator COMP1 includes a first input terminal to which the signal DQ<0> is supplied, a second input terminal to which a voltage VREF is supplied, and an output terminal connected to an input terminal of the inverter group INV1. The voltage VREF is a reference voltage (reference signal) having a constant value used for amplifying the signal DQ, and is, for example, a voltage VCCQ/2. The comparator COMP1 has a function of differentially amplifying a comparison result while adjusting a waveform (for example, duty ratio) of the signal DQ<0> by comparing the signal DQ<0> with the voltage VREF, for example. The inverter group INV1 has a function of, for example, adding an arbitrary delay amount to a signal output from the comparator COMP1 and outputting the signal as a signal Din whose phase is inverted from the output signal from the comparator COMP1.

The comparator COMP2 includes a first input terminal to which the signal DQS is supplied, a second input terminal to which the signal /DQS is supplied, a first output terminal connected to an input terminal of the inverter group INV2, and a second output terminal connected to an input terminal of the inverter group INV3. The comparator COMP2 has a function of differentially amplifying a comparison result while adjusting waveforms (for example, duty ratios) of the signals DQS and /DQS by comparing the signal DQS and the signal /DQS, for example. Each of the inverter groups INV2 and INV3 has a function of adding an arbitrary delay amount to a signal output from the comparator COMP2 and outputting the signal as each of signals SIG and /SIG having the same phase as the output signal from the comparator COMP2. Note that, the signals SIG and /SIG are, for example, signals having phases opposite to each other.

A data latch 50 has a function of latching data included in the signal Din as input data, based on the signals SIG and /SIG.

With the above configuration, the input circuits 41<0> and 41_dqs can adjust the signals DQ<0>, DQS, and /DQS to appropriate waveforms, and input the data into the chip A.

1.1.5.3 Configuration of Output Circuit

Next, details of a configuration of an output circuit in the input/output circuit according to the first embodiment is described with reference to FIG. 8.

FIG. 8 is a circuit diagram for explaining the configuration of the output circuit of the semiconductor storage device according to the first embodiment. FIG. 8 illustrates an example of a connection relationship between the pad 31<0> and the output circuit 42<0> corresponding to the pad 31<0>. Note that, since configurations of the other output circuits 42<7:1> and 42_dqs are equivalent to the configuration of the output circuit 42<0>, the description thereof is omitted.

As illustrated in FIG. 8, the output circuit 42<0> includes, for example, i logic circuits NAND<i:0> and NOR<i:0>, and transistors Tp<i:0> and Tn<i:0>. Here, i is an arbitrary natural number. The logic circuits NAND<i:0> each output a result of NAND operation of two input signals. The logic circuits NOR<i:0> each output a result of NOR operation of two input signals. The transistors Tp<i:0> each have a p-type polarity, and the transistors Tn<i:0> each have an n-type polarity.

Each of a Ron control circuit 52 and an output control circuit 53 sends a signal for controlling the signal DQ<0> output as an output signal from the pad 31<0>. Specifically, the Ron control circuit 52 sends signals SELp<i:0> and SELn<i:0> to the output circuit 42<0>, and the output control circuit 53 sends a signal Dout to the output circuit 42<0>.

The logic circuits NAND<i:0> each include a first input terminal to which the signal Dout is commonly supplied, and a second input terminal to which a corresponding one of the signals SELp<i:0> is supplied. In addition, the logic circuits NAND<i:0> are connected to gates of the transistors Tp<i:0>, respectively.

The transistors Tp<i:0> each include a first terminal to which the voltage VCCQ is commonly supplied, and a second terminal commonly connected to the pad 31<0>.

The logic circuits NOR<i:0> each include a first input terminal to which the signal Dout is commonly supplied, and a second input terminal to which a corresponding one of the signals SELn<i:0> is supplied. In addition, the logic circuits NOR<i:0> are connected to gates of the transistors Tn<i:0>, respectively.

The transistors Tn<i:0> each include a first terminal to which a voltage VSS is commonly supplied, and a second terminal commonly connected to the pad 31<0>.

With the above configuration, when the signal Dout is at the "H" level, the output circuit 42<0> can set a combined resistance of transistors selected to have an on-resistance by the signals SELp<i:0> out of the transistors Tp<i:0>, as an output impedance on a pull-up side of the signal DQ<0>. In addition, when the signal Dout is at the "L" level, the output circuit 42<0> can set a combined resistance of transistors selected to have an on-resistance by the signals SELn<i:0> out of the transistors Tn<i:0>, as an output impedance on a pull-down side of the signal DQ<0>. For this reason, the output circuit 42<0> can output the signal DQ<0> of an appropriate impedance and duty ratio, based on the signals SELp<i:0> and SELn<i:0> from the Ron control circuit 52 and the signal Dout from the output control circuit 53.

Various setting parameters for inputting and outputting the signal DQ<0> described with reference to FIGS. 7 and 8 are held in advance in the system data region 21B described above, prior to execution of the normal operation, for example. In the following description, an operation for obtaining a setting parameter capable of generating an optimum input signal and output signal is referred to as an "interface training operation". In the normal operation, the input control circuit 51 illustrated in FIG. 7 and the Ron control circuit 52 and the output control circuit 53 illustrated in FIG. 8 can appropriately control the duty ratio of the signal DQ<0> and the like by reading the various setting parameters held in advance in the system data region 21B as training results. Similarly to the signal DQ<0>, the other signals DQ<7:1>, DQS, and /DQS can also be adjusted to appropriate waveforms by reading the various setting parameters held in advance in the system data region 21B as training results.

1.2 Operation

Next, operation of the memory system according to the first embodiment is described.

1.2.1 Training Item of Interface Training Operation

Figure 9:
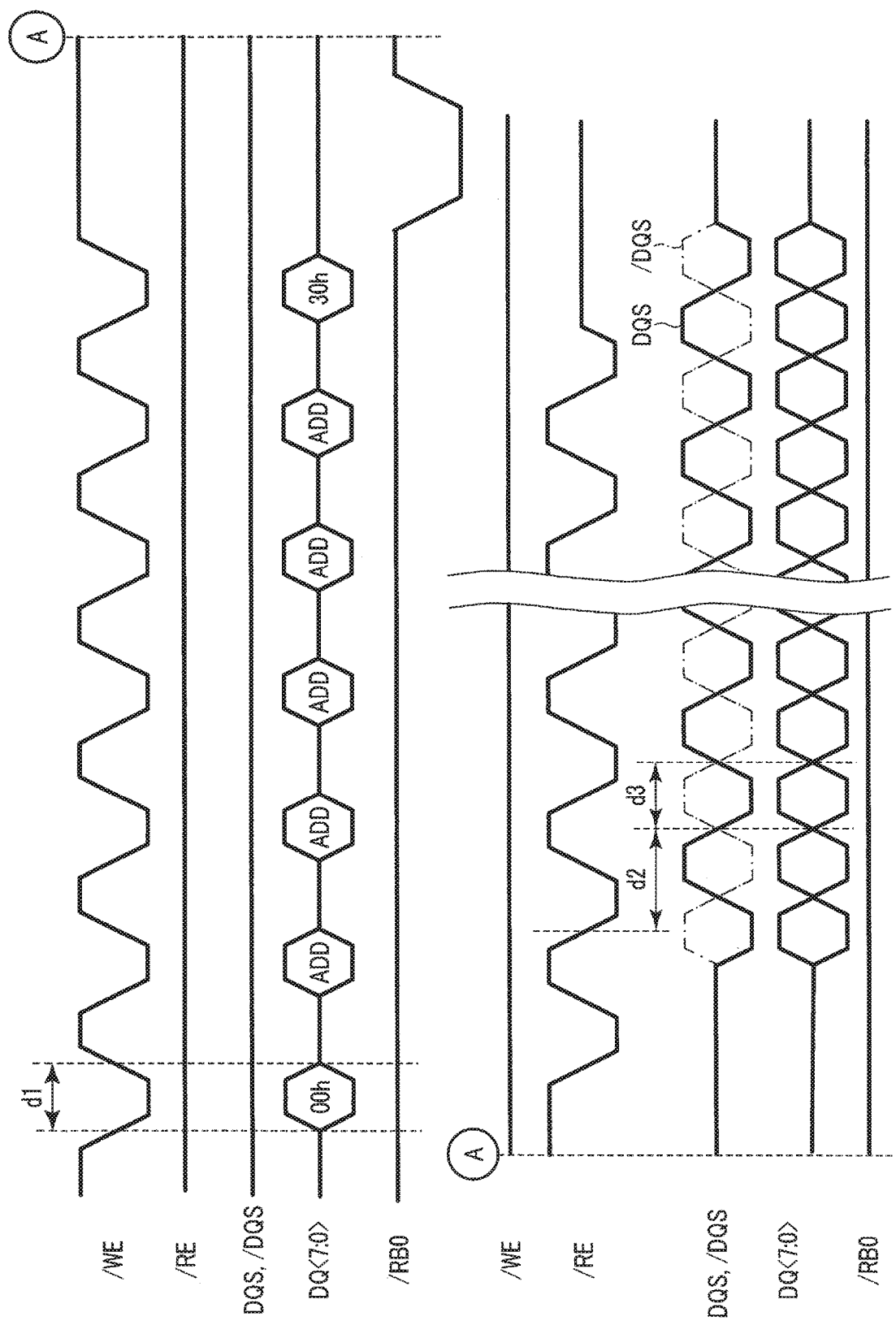
FIG. 9 is a command sequence for explaining a training item of an interface training operation in the memory system according to the first embodiment.
Figure 10:
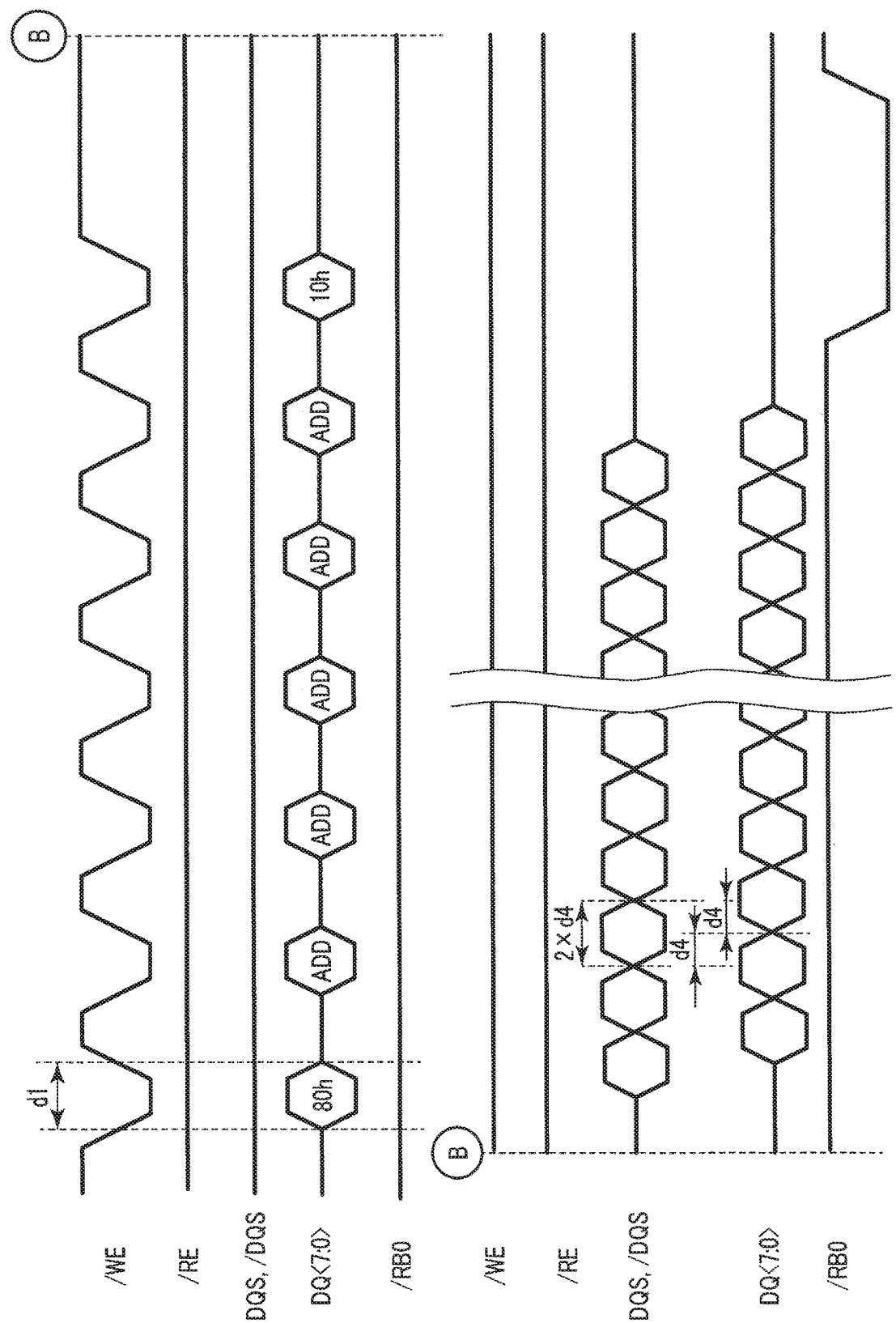
FIG. 10 is a command sequence for explaining a training item of the interface training operation in the memory system according to the first embodiment.

FIGS. 9 and 10 each are a command sequence for explaining a training item of the interface training operation in the memory system according to the first embodiment. FIGS. 9 and 10 each schematically illustrate how the setting parameter related to the signals DQ<7:0>, DQS, and /DQS is trained, by taking the command sequence in a general read operation and a general write operation executed in the normal operation as an example. Note that, in FIGS. 9 and 10, the operation for the chip A is illustrated as an example.

First, with reference to FIG. 9, the training item in the read operation is described.

As illustrated in FIG. 9, in the read operation, the memory controller 2 issues a read command "00h", an address ADD over five cycles, and a command "30h" sequentially while toggling the signal /WE, and sends them to the chip A. The command "00h" is a command for giving an instruction to read data from the user data region 21A in the chip A, and the command "30h" is a command for giving an instruction to start the read operation. Upon receiving the command "30h", the chip A starts the data read operation from the user data region 21A in the memory cell array 21, sets the signal /RB0 to the "L" level, and notifies the memory controller 2 that the chip A is in the busy state. After the data read from the user data region 21A is completed, the chip A sets the signal /RB0 to the "H" level, and notifies the memory controller 2 that the chip A is in the ready state.

The memory controller 2 confirms that the chip A is in the ready state, and then toggles the signal /RE. The chip A transfers the read data as the signal DQ<7:0> to the memory controller 2 in synchronization with the signal /RE. In the transfer, the chip A toggles the signals DQS and /DQS in synchronization with the signal DQ<7:0>, and sends the signals to the memory controller 2.

Here, as described above, the signal /WE is at the "L" level, whereby an instruction is given to take in the signal DQ<7:0> into the chip. For this reason, it is desirable that a period during which the commands "00h" and "30h", and the address ADD are input as the signal DQ<0> to the chip, is included in a period d1 during which the signal /WE is at the "L" level. For this reason, in the normal operation, for the chip A, it is desirable that a control parameter adjusted to cause the signal DQ<0> to be input at an appropriate timing and duty ratio with respect to the signal /WE, is set in advance in the input control circuit 51, by the interface training operation. Such a training item of the interface training operation with waveform shaping (also referred to as de-skew) between the signal /WE and the signal DQ<7:0> is also referred to as, for example, "write enable training".

In addition, in the above-described read operation, it is desirable that the signal DQ<7:0> as read data and the signals DQS and /DQS as strobe signals are output to the memory controller 2, at a predetermined timing to the signal /RE. Specifically, it is desirable that the signal DQS falls from the "H" level to the "L" level after a period d2 after the signal /RE falls from the "H" level to the "L" level. In addition, it is desirable that the signal DQ<7:0> is output from the chip A, for example, in the same phase as the signals DQS and /DQS (within a period coinciding with a period d3 during which the signals DQS and /DQS toggle). For this reason, in the read operation, for the chip A, it is desirable that a parameter adjusted to cause the signals DQS, /DQS, and DQ<7:0> to be output from the chip A at an appropriate timing and duty ratio with respect to the signal /RE, is set in advance in the Ron control circuit 52 and the output control circuit 53, by the interface training operation. Such a training item of the interface training operation with waveform shaping between the signal /RE and the signals DQS, /DQS, and DQ<7:0> in the read operation is also referred to as, for example, "read data de-skew".

Next, with reference to FIG. 10, the training item in the write operation is described.

As illustrated in FIG. 10, in the write operation, the memory controller 2 issues a write command "80h", the address ADD over five cycles, and a command "10h" sequentially while toggling the signal /WE, and sends them to the chip A. The command "80h" is a command for giving an instruction to write data to the user data region 21A in the chip A, and the command "10h" is a command for giving an instruction to start the write operation. Note that, the data write operation by the command "80h" is allowed in the user data region 21A but inhibited in the system data region 21B.

Subsequently, the memory controller 2 sends the data to be written to the chip A as the signal DQ<7:0> after the command "10h". Upon sending the write data, the memory controller 2 toggles the signals DQS and /DQS in synchronization with the signal DQ<7:0>, and sends the data to the chip A.

Upon receiving the write data, the chip A starts the data write operation to the user data region 21A in the memory cell array 21, sets the signal /RB0 to the "L" level, and notifies the memory controller 2 that the chip A is in the busy state. After the data write to the user data region 21A is completed, the chip A sets the signal /RB0 to the "H" level, and notifies the memory controller 2 that the chip A is in the ready state.

In the above-described write operation, it is desirable that the signal DQ<7:0> is input to the chip A, for example, in a phase delayed by 90 degrees from the signals DQS and /DQS (to cause an edge of the signal DQ<7:0> to be positioned in the middle of a period of 2×d4 during which the signals DQS and /DQS toggle). For this reason, in the write operation, for the chip A, it is desirable that a parameter adjusted to cause the signal DQ<7:0> to be input to the chip A at an appropriate timing and duty ratio with respect to the signals DQS and /DQS, is set in advance in the Ron control circuit 52 and the output control circuit 53, by the interface training operation. Such a training item of the interface training operation with waveform shaping between the signals DQS and /DQS, and the signal DQ<7:0> in the write operation is also referred to as, for example, "write data de-skew".

Also in the write operation described above, the write enable training may be executed similarly to the read operation.

In the memory system according to the first embodiment, for example, the interface training operation including the training items as described above is executed prior to the normal operation, whereby communication is guaranteed between the chip and the memory controller during the normal operation.

1.2.2 Series of Operations Including Interface Training Operation

Next, a series of operations is described including the interface training operation in the memory system according to the first embodiment with reference to a flowchart illustrated in FIG. 11.

FIG. 11 illustrates a flow of the series of operations in the memory system 1 including a test phase in which an interface training operation is executed, and an actual operation phase in which the normal operation is executed based on a result of the interface training operation. Note that, in FIG. 11, to simplify the explanation, the operation is described between the memory controller 2 and the semiconductor storage devices 3A and 3B. In the following description, the semiconductor storage devices 3A and 3B is described as the chip A and the chip B, respectively.

As illustrated in FIG. 11, steps ST10 to ST28 illustrate the operation in the test phase, and steps ST30 to ST34 illustrate the operation in the actual operation phase. Note that, it is assumed that the following steps are executed in a state in which at least the memory controller 2 and the NAND package 3 are assembled in the memory system 1, in both the test phase and the actual operation phase.

In step ST10, the memory system 1 is powered on. The power manager 4 supplies the voltage VCCQ to the memory controller 2 and the NAND package 3, and further supplies the voltage VCC to the NAND package 3.

After the power is turned on, first, the interface training operation is executed for the chip A.

In step ST12, the memory controller 2 issues a command (I/F training execution command) for executing the interface training operation for the chip A, and sends the command to the chip A.

Upon receiving the I/F training execution command in step ST14, the chip A executes the interface training operation. For example, a plurality of types of training items as described with reference to FIGS. 9 and 10 may be trained in the interface training operation. When the interface training operation is finished, the chip A sends a training finish notification to the memory controller 2.

In step ST16, the memory controller 2 issues a command (training result storing command) for storing a training result for the chip A and sends the command to the chip A.

Upon receiving the training result storing command in step ST18, the chip A stores a result of the interface training operation executed in step ST14 in the system data region 21B in the chip A.

Thus, the interface training operation is finished for the chip A.

Subsequently, the interface training operation is executed for the chip B.

In step ST20, the memory controller 2 issues an I/F training execution command for the chip B, and sends the command to the chip B.

Upon receiving the I/F training execution command in step ST22, the chip B executes the interface training operation. For example, when the interface training operation is finished, the chip B sends a training finish notification to the memory controller 2.

In step ST24, the memory controller 2 issues a training result storing command for the chip B, and sends the command to the chip B.

Upon receiving the training result storing command in step ST26, the chip B stores a result of the interface training operation executed in step ST22 in the system data region 21B in the chip B.

Thus, the interface training operation is finished for the chip B.

In this manner, the interface training operation is sequentially executed for all the chips, and each training result is stored in a nonvolatile manner in the system data region 21B in memory cell array 21 of the corresponding chip.

In step ST28, the power manager 4 stops power supply to the memory controller 2 and the NAND package 3, and the test phase is ended. Thereafter, the memory system 1 is shipped, and the phase is shifted to the actual operation phase.

In step ST30, the memory system 1 is powered on again.

In step ST32, various setting parameters stored in the NAND package 3 are read as the power is turned on (power-on read process). In the power-on read process, the training result is also read stored in the system data region 21B in each chip in steps ST18 and ST26, and set in the input control circuit 51, the Ron control circuit 52, the output control circuit 53, and the like in the input/output circuit 22.

In step ST34, the normal operation is executed including the write operation to the user data region 21A and the read operation from the user data region 21A. In the normal operation, input/output signals are generated to which the training result is applied. As a result, occurrence of an error in communication between the memory controller 2 and the NAND package 3 can be suppressed.

Thus, a series of processes is finished.

1.2.3 Command Sequence of Interface Training Operation

Figure 12:
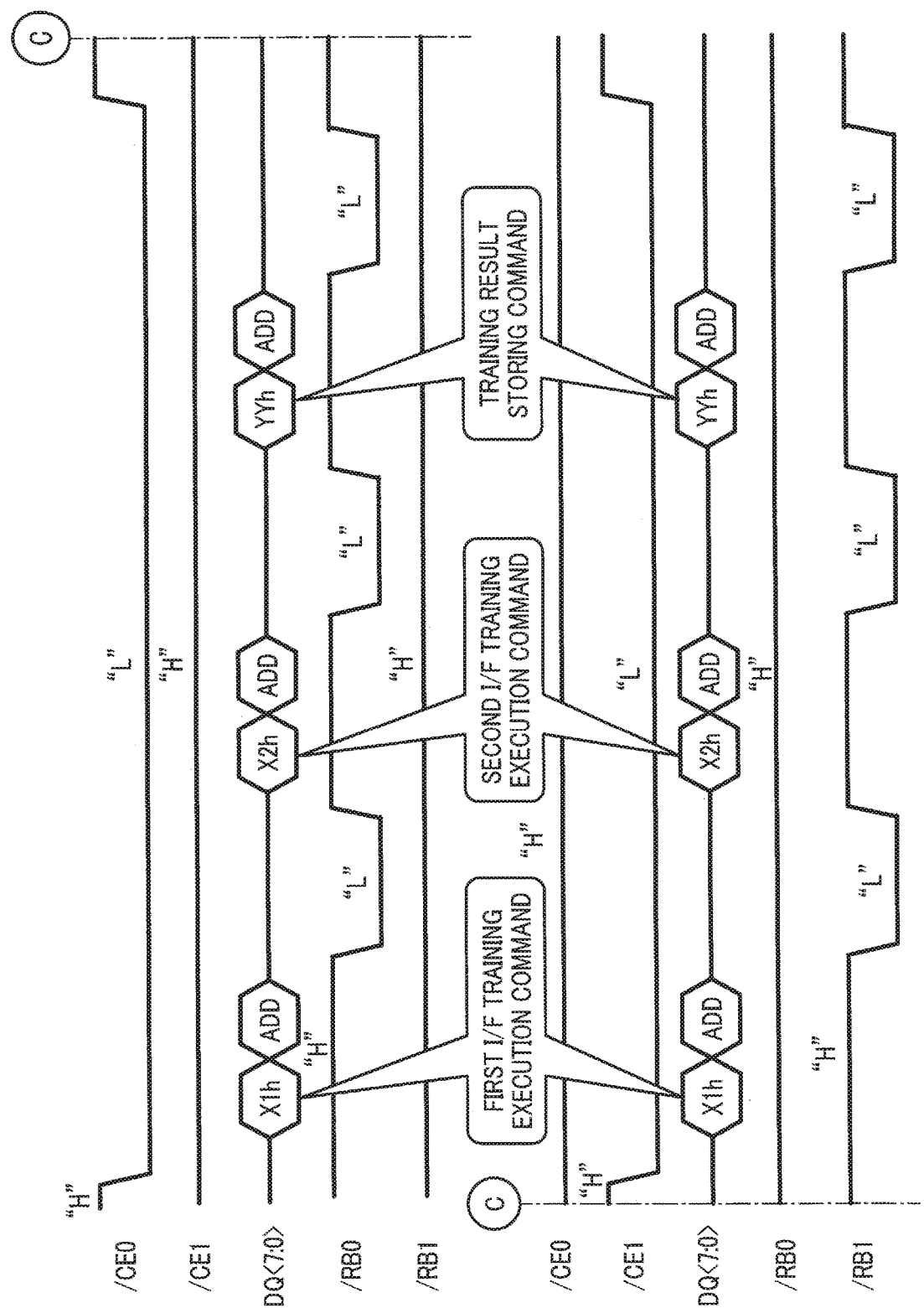
FIG. 12 is a command sequence for explaining the interface training operation in the memory system according to the first embodiment.

FIG. 12 is a command sequence for explaining the interface training operation in the memory system according to the first embodiment. FIG. 12 corresponds to steps ST12 to ST26 in FIG. 11. In addition, FIG. 12 illustrates an example in which the interface training operation including two types of training items is executed for each of the chip A and the chip B.

As illustrated in FIG. 12, the memory controller 2 sets the signal /CE0 to the "L" level to enable the chip A. The signal /CE1 is maintained at the "H" level.

The memory controller 2 issues a command "X1h" as the interface training execution command. The command "X1h" is, for example, a command for giving an instruction to execute an interface training operation (first I/F training operation) corresponding to a first type training item. Subsequently, the memory controller 2 issues the address ADD. The address ADD includes, for example, a chip address corresponding to a training target chip (that is, the chip A).

Upon receiving the command "X1h" and the following address ADD, the chip A starts the first I/F training operation, sets the signal /RB0 to the "L" level, and notifies the memory controller 2 that the chip A is in the busy state. After the first I/F training operation is finished, the chip A sets the signal /RB0 to the "H" level, and notifies the memory controller 2 that the chip A is in the ready state.

Subsequently, the memory controller 2 issues a command "X2h" as the interface training execution command. The command "X2h" is, for example, a command for giving an instruction to execute an interface training operation (second I/F training operation) corresponding to a second type training item. Subsequently, the memory controller 2 issues the address ADD including the chip address corresponding to the chip A.

Upon receiving the command "X2h" and the following address ADD, the chip A starts the second I/F training operation, sets the signal /RB0 to the "L" level, and notifies the memory controller 2 that the chip A is in the busy state. After the second I/F training operation is finished, the chip A sets the signal /RB0 to the "H" level, and notifies the memory controller 2 that the chip A is in the ready state.

Subsequently, the memory controller 2 issues a command "YYh" as the training result storing command. Subsequently, the memory controller 2 issues the address ADD including the chip address corresponding to the chip A.

Upon receiving the command "YYh" and the following address ADD, the chip A starts a training result storing operation, sets the signal /RB0 to the "L" level, and notifies the memory controller 2 that the chip A is in the busy state. After storing the training result by each of the first I/F training operation and the second I/F training operation in the system data region 21B, the chip A sets the signal /RB0 to the "H" level, and notifies the memory controller 2 that the chip A is in the ready state.

The memory controller 2 sets the signal /CE0 to the "H" level, and disables the chip A. With the above operations, steps ST12 to ST18 in FIG. 11 are finished.

Thereafter, operations similar to those for the chip A are also executed for the chip B. That is, the memory controller 2 sets the signal /CE1 to the "L" level to enable the chip B. The signal /CE0 is maintained at the "H" level.

The memory controller 2 issues the command "X1h" as the interface training execution command, and the address ADD including a chip address corresponding to the chip B.

Upon receiving the command "X1h" and the following address ADD, the chip B starts the first I/F training operation, sets the signal /RB1 to the "L" level, and notifies the memory controller 2 that the chip B is in the busy state. After the first I/F training operation is finished, the chip B sets the signal /RB1 to the "H" level, and notifies the memory controller 2 that the chip B is in the ready state.

Subsequently, the memory controller 2 issues the command "X2h" and the address ADD including the chip address corresponding to the chip B.

Upon receiving the command "X2h" and the following address ADD, the chip B starts the second I/F training operation, sets the signal /RB1 to the "L" level, and notifies the memory controller 2 that the chip B is in the busy state. After the second I/F training operation is finished, the chip B sets the signal /RB1 to the "H" level, and notifies the memory controller 2 that the chip B is in the ready state.

Subsequently, the memory controller 2 issues the command "YYh" as the training result storing command, and the address ADD including the chip address corresponding to the chip B.

Upon receiving the command "YYh" and the following address ADD, the chip B starts a training result storing operation, sets the signal /RB1 to the "L" level, and notifies the memory controller 2 that the chip B is in the busy state.

After storing the training result by the first I/F training operation and the second I/F training operation in the system data region 21B, the chip B sets the signal /RB1 to the "H" level, and notifies the memory controller 2 that the chip B is in the ready state.

The memory controller 2 sets the signal /CE1 to the "H" level, and disables the chip B. With the above operations, steps ST20 to ST26 in FIG. 11 are finished.

1.3 Advantageous Effects of Present Embodiment

According to the first embodiment, the time required for setting the training result can be suppressed. This effect is described below.

The memory controller 2 issues an I/F training execution command to the NAND package 3 in the test phase corresponding to a phase before the shipment of the memory system 1. Upon receiving the I/F training execution command, the chip in the NAND package 3 executes the interface training operation, and acquires an optimum parameter applied to the communication with the memory controller 2. After the interface training operation, the memory controller 2 further issues a training result storing command to the NAND package 3. Upon receiving the training result storing command, the chip in the NAND package 3 stores the acquired parameter in the system data region 21B in the memory cell array 21. As a result, even after the power of the memory system 1 is turned off after the end of the test phase, the training result is stored in a nonvolatile manner in the NAND package 3. For this reason, in the actual operation phase corresponding to a phase after the shipment of the memory system 1, the training result can be read from the system data region 21B in the power-on read process after power on. That is, the NAND package 3 can set an optimum training result in the input/output circuit 22 without executing the interface training operation in the actual operation phase. Therefore, the time for activating the memory system 1 can be suppressed by omitting execution of the interface training operation.

Supplementally, with increase in storage capacity, it is required that an interface between the memory controller 2 and the NAND package 3 can be communicated at high speed. When the interface speeds up, a margin for interface characteristics decreases, so that it may be necessary to execute the interface training operation to improve the characteristics. However, when the number of chips in the NAND package 3 increases with the increase in the storage capacity, the time required for the interface training operation may increase depending on the number of chips. In addition, when the training items are increased to accurately improve the characteristics, the time required for the interface training operation may increase depending on the number of training items. As described above, since the time required for the interface training operation tends to increase, the time until activation of the memory system 1 may become longer when the interface training operation is executed at the time of power on in the actual operation phase.

According to the first embodiment, the interface training operation is executed during the test phase, and the training result is stored in the system data region 21B in a nonvolatile manner. As a result, the time can be omitted for the interface training operation in the actual operation phase, and the memory system 1 can be promptly activated.

2. Second Embodiment

Next, a memory system according to a second embodiment is described.

In the first embodiment, a case has been described where a training result executed in a test phase is uniquely applied in an actual operation phase; however, this is not a limitation. For example, in the test phase, an interface training operation may be executed under a plurality of environments for the same training item, and the training result may be adaptively applied depending on a change in the environment in the actual operation phase. In the following, descriptions is omitted of a configuration and operation equivalent to those of the first embodiment, and a configuration and operation different from those of the first embodiment is mainly described.

2.1 Series of Operations Including Interface Training Operation

Figure 13:
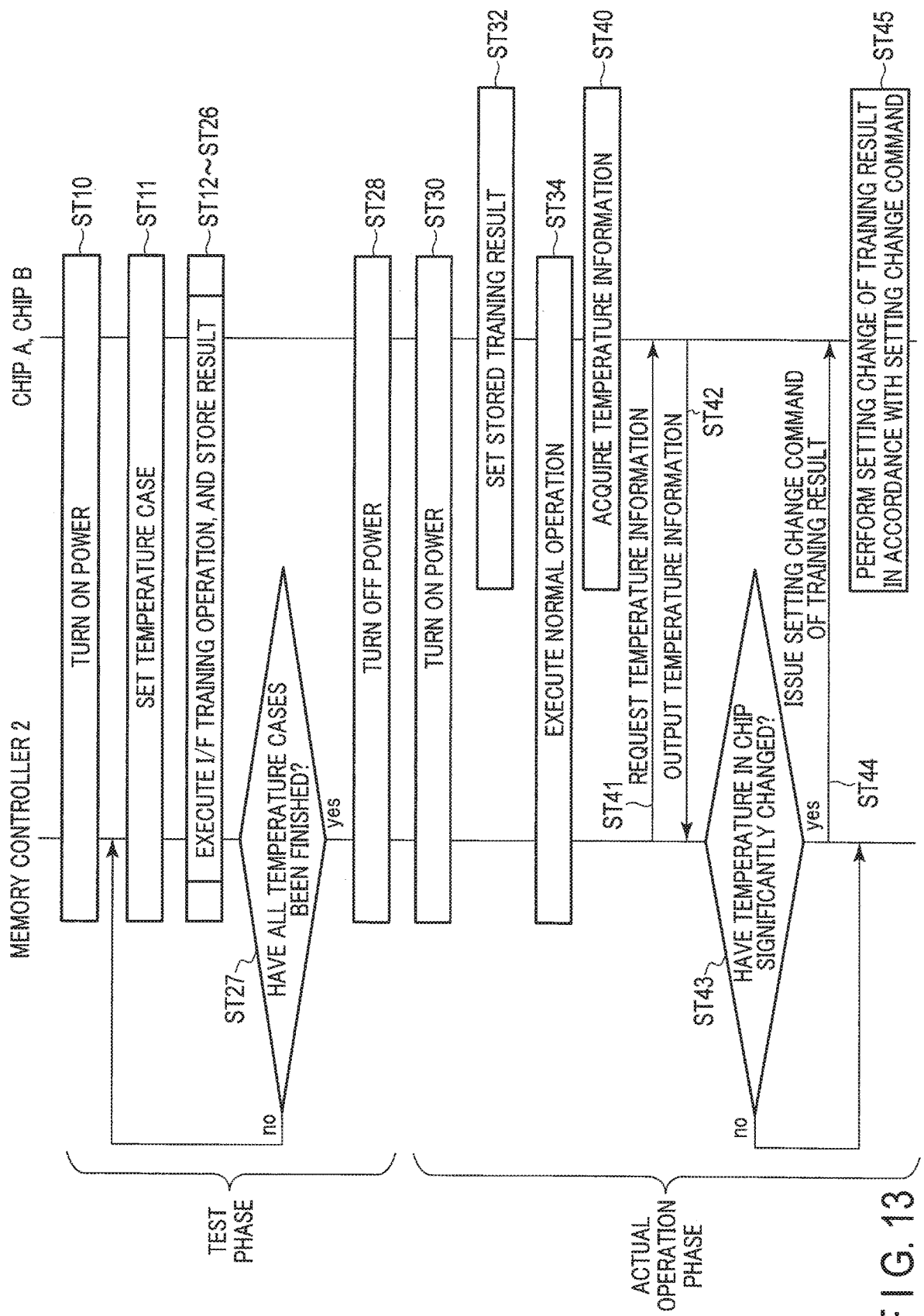
FIG. 13 is a flowchart for explaining a series of operations including an interface training operation in a memory system according to a second embodiment.

A series of operations is described including an interface training operation in the memory system according to the second embodiment with reference to the flowchart illustrated in FIG. 13.

FIG. 13 corresponds to FIG. 11 in the first embodiment, and a case is illustrated where step ST11 is added between steps ST10 and ST12 illustrated in FIG. 11, step ST27 is added between steps ST26 and ST28, and steps ST40 to ST45 are added after step ST34.

As illustrated in FIG. 13, in step ST10, a memory system 1 is powered on.

In step ST11, the memory system 1 sets a temperature environment of a memory controller 2, a chip A, and a chip B in accordance with a predetermined test case. An arbitrary case can be set as the test case (temperature case) of the temperature environment, and, for example, cases are assumed such as a normal temperature case, a high temperature case, and a low temperature case. For example, when the normal temperature case is set as the temperature case, the temperature environment of the memory system 1 is set to a temperature environment in which the memory system 1 is normally used in the actual operation phase. In addition, for example, when the high temperature case and the low temperature case are set as the temperature cases, the temperature environments of the memory system 1 are set to a higher temperature and a lower temperature than in the normal temperature case, respectively.

In steps ST12 to ST26, the memory system 1 executes the interface training operation, and stores the training result. Note that, in steps ST16 and ST24, in issuance of a training result storing command, the memory controller 2 designates a storage destination of the training result. As a result, in steps ST18 and ST26, the chip A and the chip B can individually store the training result in a system data region 21B for each temperature case.

In step ST27, the memory controller 2 determines whether or not the interface training operation has been executed for all the temperature cases. When it is determined that there is a temperature case in which the interface training operation has not been finished (step ST27; no), the process returns to step ST11 and steps ST11 to ST26 are repeatedly executed. When it is determined that the interface training operation has been finished for all the temperature cases (step ST27; yes), the process proceeds to step ST28.

In step ST28, power supply to the memory system 1 is stopped, and the test phase is ended.

In step ST30, the memory system 1 is powered on again.

In step ST32, a power-on read process is executed as the power is turned on. In the power-on read process, the training result stored in the system data region 21B in each chip in steps ST18 and ST26 is also read, and set in an input control circuit 51, a Ron control circuit 52, an output control circuit 53, and the like. Note that, in the power-on read process, for example, it is assumed that the training result in a default temperature state (that is, the normal temperature case) is read, and set in each circuit.

In step ST34, the normal operation is executed including the write operation to the user data region 21A and the read operation from the user data region 21A.

In step ST40, the chip A and the chip B each acquire temperature information detected by a temperature sensor 24. Acquisition of the temperature information can be executed at an arbitrary timing, and, for example, may be executed together with a write operation or a read operation in the normal operation, or may be executed in accordance with an instruction (not illustrated) from the memory controller 2.

In step ST41, the memory controller 2 issues a temperature information acquisition request to the chip A and the chip B.

In step ST42, the chip A and the chip B output the temperature information acquired in step ST40 to the memory controller 2 in response to the temperature information acquisition request.

In step ST43, the memory controller 2 determines whether or not a significant change has occurred in the temperatures in the chip A and the chip B, based on the acquired temperature information. Here, a temperature change is "significant" means that the temperature in the chip is changed to be out of a range corresponding to the current temperature case set in step ST32 (that is, within a range corresponding to another temperature case). When it is determined that the temperature change in the chip is significant (step ST43; yes), it is determined that a setting change of the training result is necessary, and the process proceeds to step ST44. On the other hand, when it is determined that the temperature change in the chip is not significant (step ST43; no), it is determined that the setting change of the training result is unnecessary, and a series of processes is finished.

In step ST44, the memory controller 2 issues a setting change command for changing a setting of the temperature case in the training result, and sends the command to a chip whose temperature change in the chip is determined to be significant in step ST43.

In step ST45, the chip receiving the setting change command performs the setting change of the temperature case in the training result in accordance with the setting change command.

Thus, a series of processes is finished.

2.2 Command Sequence of Interface Training Operation

Figure 14:
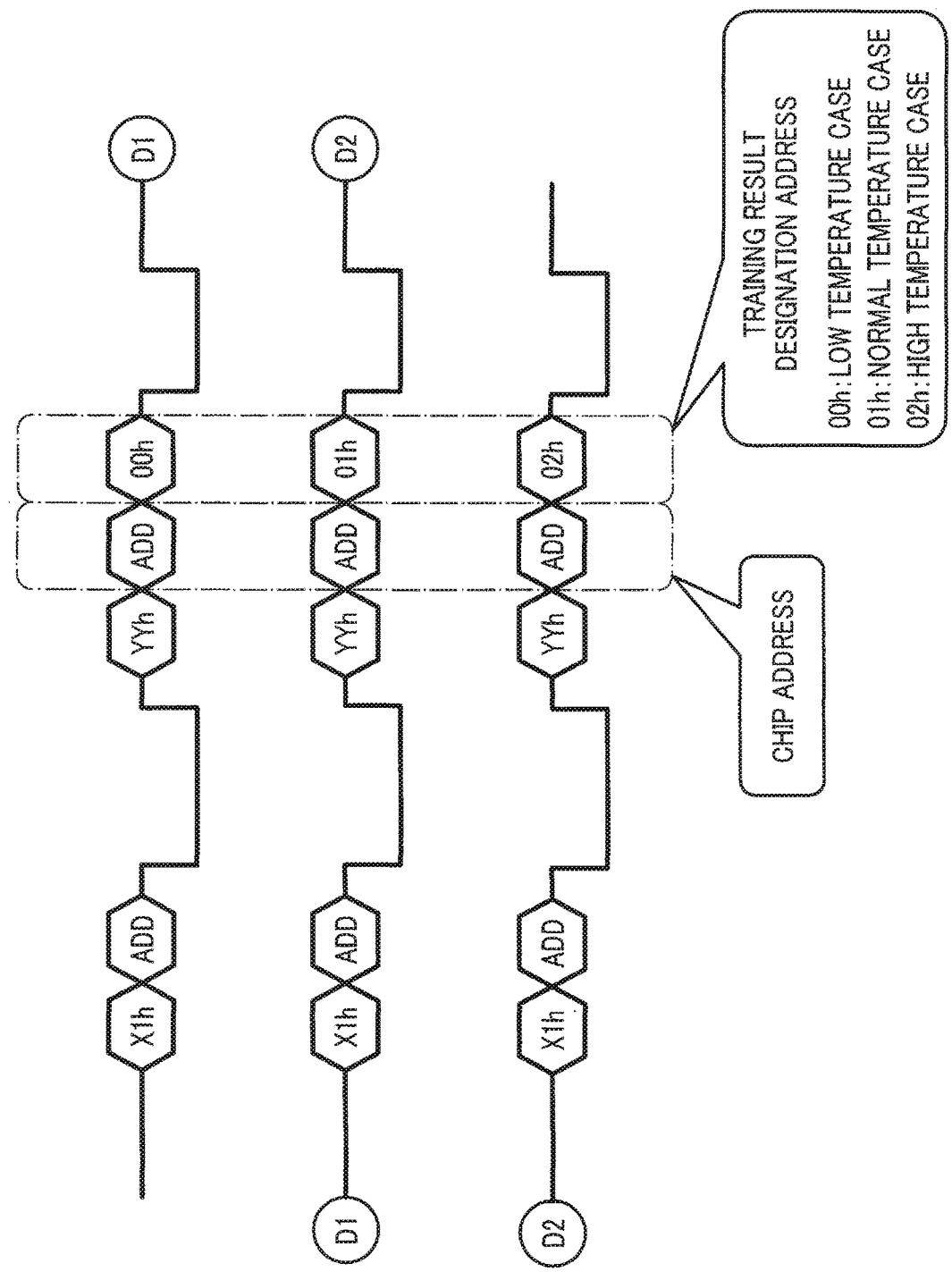
FIG. 14 is a command sequence for explaining the interface training operation in the memory system according to the second embodiment.

FIG. 14 is a command sequence for explaining the interface training operation in the memory system according to the second embodiment. FIG. 14 illustrates signals DQ<7:0> and /RB in FIG. 12 in the first embodiment, in a simplified manner. In addition, in FIG. 14, to simplify the explanation, as an example, a case is extracted and illustrated where the interface training operation is executed corresponding to three temperature cases, for a first I/F training operation to the chip A. Note that, in the example of FIG. 14, a case is illustrated where the temperature case is executed in the order of the low temperature case, the normal temperature case, and the high temperature case.

First, the memory system 1 is set to a temperature state corresponding to the low temperature case.

Then, as illustrated in FIG. 14, the memory controller 2 issues a command "X1h" and an address ADD including a chip address of the chip A, and instructs the chip A to execute the first I/F training operation. The chip A starts the first I/F training operation in a low temperature state in accordance with the command "X1h" and the address ADD.

Subsequently, the memory controller 2 issues a command "YYh". Subsequently, the memory controller 2 sequentially issues the address ADD including the chip address corresponding to the chip A, and an address (training result designation address) 00h that can designate a storage destination of the training result for each test case. In the example of FIG. 14, the address 00h is associated with the low temperature case, and the training result of the low temperature case is stored in the system data region 21B corresponding to the address 00h.

Thereafter, similarly, training operations are executed for the normal temperature case and the high temperature case, and the training result is stored in each storage destination.

The memory system 1 is set to a temperature state corresponding to the normal temperature case.

The memory controller 2 issues the command "X1h" and the address ADD including the chip address of the chip A. The chip A starts the first I/F training operation in a normal temperature state in accordance with the command "X1h" and the address ADD.

Subsequently, the memory controller 2 sequentially issues the command "YYh", the address ADD including the chip address corresponding to the chip A, and a training result designation address 01h associated with the normal temperature case. As a result, the training result of the normal temperature case is stored in the system data region 21B corresponding to the address 01h.

Next, the memory system 1 is set to a temperature state corresponding to the high temperature case.

The memory controller 2 issues the command "X1h" and the address ADD including the chip address of the chip A. The chip A starts the first I/F training operation in a high temperature state in accordance with the command "X1h" and the address ADD.

Subsequently, the memory controller 2 sequentially issues the command "YYh", the address ADD including the chip address corresponding to the chip A, and a training result designation address 02h associated with the high temperature case. As a result, the training result of the high temperature case is stored in the system data region 21B corresponding to the address 02h.

With the above operations, the training result corresponding to each of the temperature cases can be individually stored in the system data region 21B.

2.3 Command Sequence of Setting Change Operation of Training Result

Figure 15:
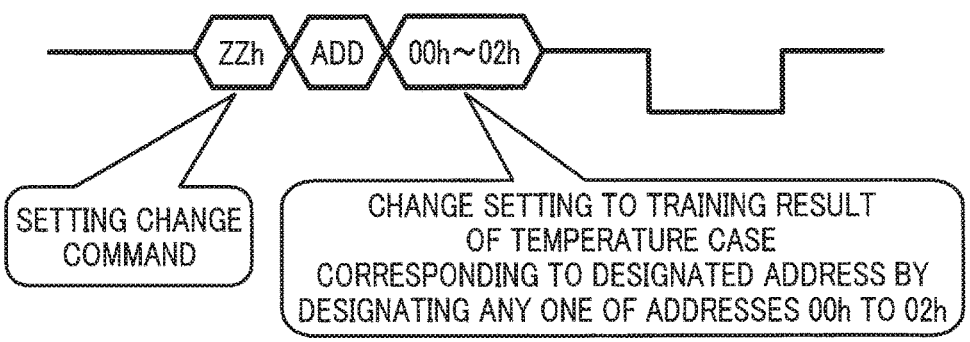
FIG. 15 is a command sequence for explaining a setting change operation of an interface training result in the memory system according to the second embodiment.
Figure 16:
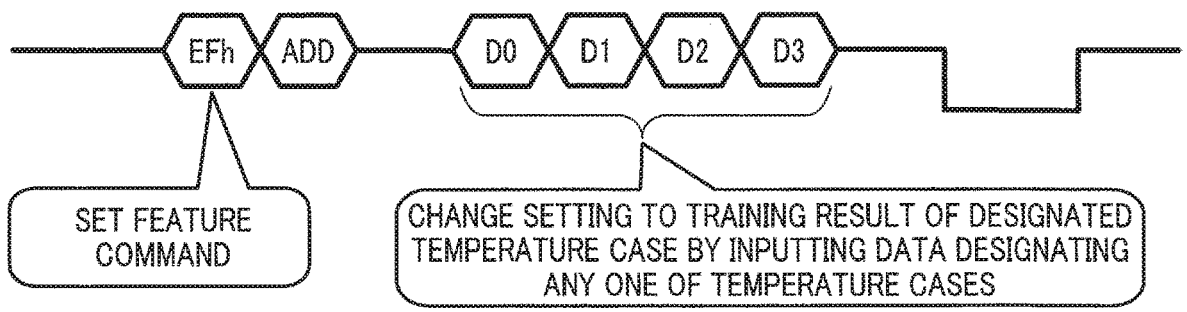
FIG. 16 is a command sequence for explaining the setting change operation of the interface training result in the memory system according to the second embodiment.

Next, a setting change operation is described of the training result in the memory system according to the second embodiment with reference to command sequences illustrated in FIGS. 15 and 16.

FIGS. 15 and 16 each are an example of a command sequence that can implement the setting change of the training result. FIG. 15 illustrates a case where a dedicated command is used for the setting change operation, and FIG. 16 illustrates a case where a set feature command is used that is a general command.

First, a case is described where the setting change is performed by the dedicated command with reference to FIG. 15.

As illustrated in FIG. 15, the memory controller 2 transmits a command "ZZh" to the chip A. The command "ZZh" is a command (setting change command) for instructing the chip A to perform the setting change of the training result to a designated temperature case. Subsequently, the memory controller 2 sequentially sends the address ADD including the chip address of the chip A and any one of the training result designation addresses 00h to 02h. As a result, in the chip A, a current set value is subjected to the setting change to the training result corresponding to the designated temperature case, and applied to the subsequent process.

Next, a case is described where the setting change is performed by the set feature command with reference to FIG. 16.

As illustrated in FIG. 16, the memory controller 2 transmits a command "EFh" to the chip A. The command "EFh" is the set feature command for instructing the chip A to change various settings including the training result. Subsequently, the memory controller 2 sends the address ADD including the chip address of the chip A, and then sends data over four cycles ("D0" to "D3"). The data "D0" to "D3" are information on the set value to be changed by the set feature command, and here, data is included for designating one of the temperature cases in the training result. As a result, in the chip A, a current set value is subjected to the setting change to the training result corresponding to the designated temperature case, and applied to the subsequent process.

With the above operations, the setting change of the training result can be performed depending on the temperature case, by any of the methods of FIGS. 15 and 16.

2.3 Advantageous Effects of Present Embodiment

According to the second embodiment, in the test phase, the memory system 1 executes interface training operations for mutually different temperature cases, and stores respective results in the system data region 21B in a memory cell array 21. The memory controller 2 determines whether or not the temperature in a NAND package 3 is within the range of a currently set temperature case, based on the temperature information of the NAND package 3 acquired by the temperature sensor 24. Then, when the temperature in the NAND package 3 is out of the currently set temperature case, the setting change command "ZZh" is issued for changing the setting to the training result of an appropriate temperature case. As a result, the memory system 1 can avoid that the parameter set in an input/output circuit 22 is not optimum due to the temperature change in the NAND package 3, and adaptively apply an optimum training result depending on the temperature change.

2.4 Modification

In the second embodiment, a case has been described where the setting change command "ZZh" or the set feature command "EFh" is issued from the memory controller 2, whereby the setting of the training result in the NAND package 3 is changed; however, this is not a limitation. For example, the NAND package 3 may be configured to autonomously change the setting of the training result, based on information of the temperature sensor 24 inside. In the following, descriptions of a configuration and operation equivalent to those of the second embodiment is omitted, and a configuration and operation different from those of the second embodiment is mainly described.

Figure 17:
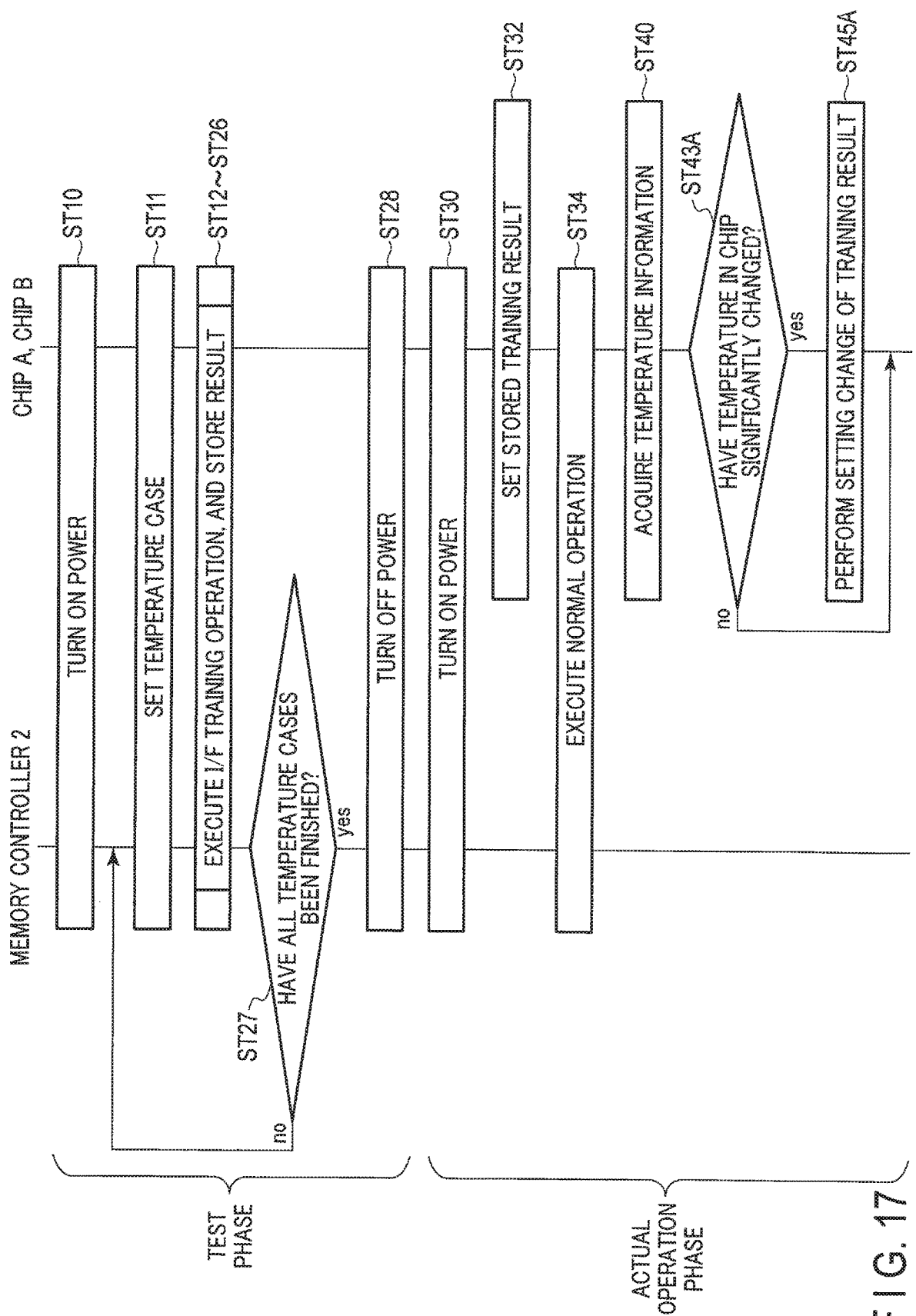
FIG. 17 is a flowchart for explaining a series of operations including an interface training operation in a memory system according to a modification of the second embodiment.

FIG. 17 is a flowchart for explaining a series of operations in a memory system including the test phase and the actual operation phase in the memory system according to a modification of the second embodiment. FIG. 17 corresponds to FIG. 13 in the second embodiment.

As illustrated in FIG. 17, since the operation of the test phase in steps ST10 to ST28 is equivalent to that in the case of FIG. 13, the description is omitted.

Since the operation in steps ST30 to ST34 of the actual operation phase is equivalent to that in the case of FIG. 13, the description will be omitted.

In step ST40, the chip A and the chip B acquire temperature information detected by a temperature sensor 24. Acquisition of the temperature information can be executed at an arbitrary timing, and, for example, may be executed together with a write operation or a read operation in the normal operation, or may be executed in accordance with an instruction (not illustrated) from the memory controller 2.

In step ST43A, the chip A and the chip B each determine whether or not a significant change has occurred in the internal temperature, based on the temperature information acquired. When it is determined that the temperature change in the chip is significant (step ST43A; yes), it is determined that a setting change of the training result is necessary, and the process proceeds to step ST45A. Note that, in the setting change, each of the chip A and the chip B may determine whether to perform the setting change to the high temperature case or perform the setting change to the low temperature case, depending on whether the temperature in the chip is above the upper limit of the range of the currently set temperature case or below the lower limit. On the other hand, when it is determined that the temperature change in the chip is not significant (step ST43A; no), it is determined that the setting change of the training result is unnecessary, and a series of processes is finished.

In step ST45A, a chip whose internal temperature change is determined to be significant, performs the setting change of the temperature case of the training result, based on a determination result in step ST43A.

Thus, a series of processes is finished.

With the above operations, the NAND package 3 can autonomously change the training result without receiving the setting change command "ZZh" or the set feature command "EFh" from the memory controller 2.

3. Third Embodiment

In the second embodiment, a case has been described where a training result is changed based on a temperature in a NAND package 3; however, this is not a limitation. For example, the training result may be adaptively changed depending on a change in a voltage (for example, a voltage VCCQ) used for an input/output circuit 22. In the following, descriptions of a configuration and operation equivalent to those of the second embodiment is omitted, and a configuration and operation different from those of the second embodiment is mainly described.

3.1 Series of Operations Including Interface Training Operation

A series of operations including an interface training operation in a memory system according to a third embodiment is described with reference to a flowchart illustrated in FIG. 18.

Figure 18:
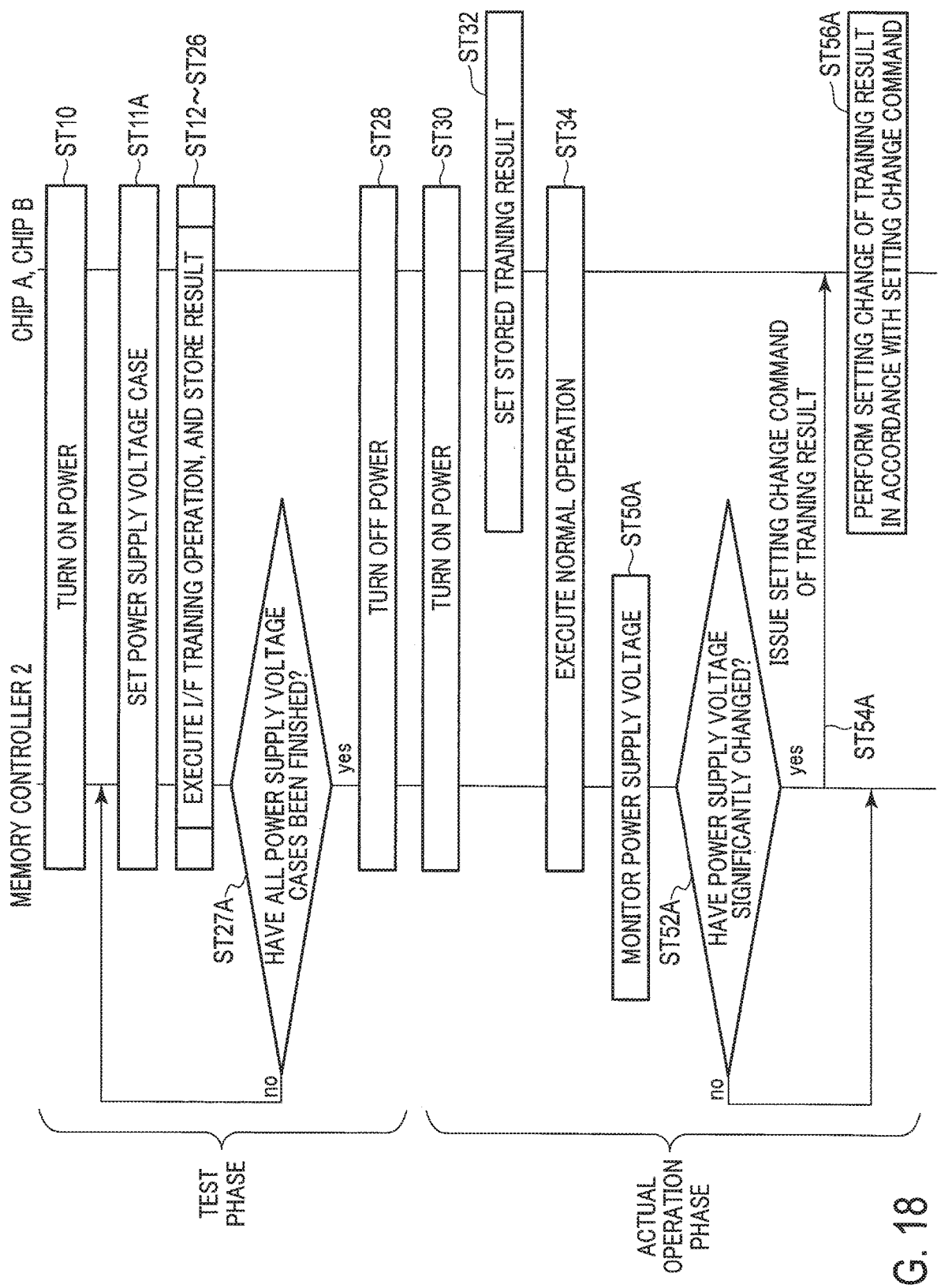
FIG. 18 is a flowchart for explaining a series of operations including an interface training operation in a memory system according to a third embodiment.

FIG. 18 corresponds to FIG. 13 in the second embodiment, and illustrates a case where steps ST11A and ST27A are executed instead of steps ST11 and ST27 illustrated in FIG. 13, and steps ST50A, ST52A, ST54A, and ST56A are executed instead of steps ST40 to ST45.

As illustrated in FIG. 18, in step ST10, a memory system 1 is powered on.

In step ST11A, the memory system 1 sets a power supply voltage environment of a memory controller 2, a chip A, and a chip B in accordance with a predetermined test case. An arbitrary case can be set as a test case (power supply voltage case) of the power supply voltage environment, and for example, cases are assumed such as a low voltage case, a normal voltage case, and a high voltage case. For example, when the normal voltage case is set as the power supply voltage case, the power supply voltage environment of the memory system 1 is set to a (default) power supply voltage environment in which the memory system 1 is normally used in an actual operation phase. In addition, for example, when the low voltage case and the high voltage case are set as the power supply voltage cases, the power supply voltage environments of the memory system 1 are set to a lower voltage and a higher voltage than in the normal voltage case, respectively.

In steps ST12 to ST26, the memory system 1 executes the interface training operation, and stores the training result. Note that, in steps ST16 and ST24, in issuance of a training result storing command, the memory controller 2 designates a storage destination of the training result so that the training result is stored to be identifiable for each power supply voltage case. As a result, in steps ST18 and ST26, the chip A and the chip B individually store the training result in a system data region 21B for each power supply voltage case.

In step ST27A, the memory controller 2 determines whether or not the interface training operation has been executed for all the power supply voltage cases. When it is determined that there is a power supply voltage case in which the interface training operation has not been finished (step ST27 A; no), the process returns to step ST11A and steps ST11A to ST26 are repeatedly executed. When it is determined that the interface training operation has been finished for all the power supply voltage cases (step ST27A; yes), the process proceeds to step ST28.

In step ST28, power supply to the memory system 1 is stopped, and the test phase is ended.

In step ST30, the memory system 1 is powered on again.

In step ST32, a power-on read process is executed as the power is turned on. In the power-on read process, the training result stored in the system data region 21B in each chip in steps ST18 and ST26 is also read, and set in an input control circuit 51, a Ron control circuit 52, an output control circuit 53, and the like. Note that, in the power-on read process, for example, it is assumed that the training result in a default power supply voltage state (that is, the normal voltage case) is read, and set in each circuit.

In step ST34, the normal operation is executed including the write operation to the user data region 21A and the read operation from the user data region 21A.

In step ST50A, the memory controller 2 monitors the voltage VCCQ supplied from a power manager 4. Monitoring of the voltage VCCQ can be executed regularly or irregularly at an arbitrary timing.

In step ST52A, the memory controller 2 determines whether or not a significant change has occurred in the voltage VCCQ used for communication with the NAND package 3, based on a monitoring result of the voltage VCCQ. When it is determined that a power supply voltage change is significant (step ST52 A; yes), it is determined that a setting change of the training result is necessary, and the process proceeds to step ST54A. On the other hand, when it is determined that the power supply voltage change is not significant (step ST52A; no), it is determined that the setting change of the training result is unnecessary, and a series of processes is finished.

In step ST54A, the memory controller 2 issues a setting change command for changing a setting of the power supply voltage case in the training result, and sends the command to each chip in the NAND package 3. Note that, the setting change command issued in step ST54A may be a setting change command "ZZh" that is a dedicated command for the interface training operation, or may be a set feature command "EFh" that is a general command used also for another setting change.

In step ST56A, the chip receiving the setting change command performs the setting change of the power supply voltage case in the training result in accordance with the setting change command.

Thus, a series of processes is finished.

3.2 Advantageous Effects of Present Embodiment

According to the third embodiment, in the test phase, the memory system 1 executes interface training operations for mutually different power supply voltage cases, and stores respective results in the system data region 21B in a memory cell array 21. The memory controller 2 determines whether or not the voltage VCCQ is within a range of a currently set power supply voltage case, based on the monitoring result of the voltage VCCQ supplied from the power manager 4. Then, when the voltage VCCQ is out of the currently set power supply voltage case, the setting change command "ZZh" is issued for changing the setting to the training result of an appropriate power supply voltage case. As a result, the memory system 1 can avoid that the parameter set in the input/output circuit 22 is not optimum due to the change in the voltage VCCQ, and adaptively apply an optimum training result depending on the power supply voltage change.

In the third embodiment, as in the second embodiment, not only the setting change command "ZZh" but also the set feature command "EFh" can be applied as a command for changing the setting to the training result of the power supply voltage case. As a result, the training result can be changed depending on the change in the power supply voltage without using the dedicated command.

4. Fourth Embodiment

In the third embodiment, a case has been described where a memory controller 2 monitors a power supply voltage and changes a training result depending on a result of the monitoring; however, this is not a limitation. For example, the training result may be adaptively changed depending on a change in frequency (or data rate) in communication with a NAND package 3. In the following, descriptions of a configuration and operation equivalent to those of the third embodiment is omitted, and a configuration and operation different from those of the third embodiment is mainly described.

4.1 Series of Operations Including Interface Training Operation

A series of operations including an interface training operation in a memory system according to a fourth embodiment is described with reference to a flowchart illustrated in FIG. 19.

Figure 19:
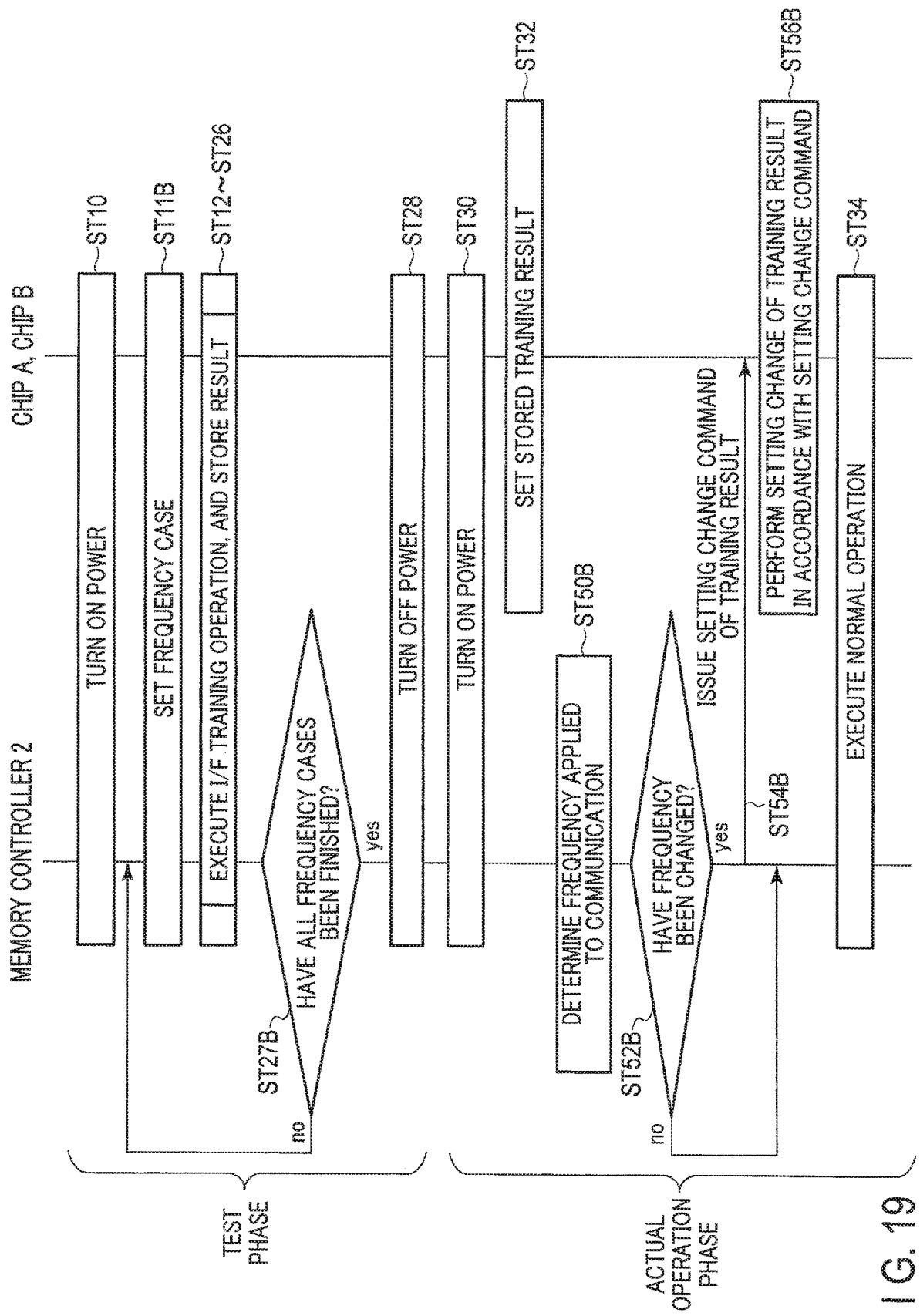
FIG. 19 is a flowchart for explaining a series of operations including an interface training operation in a memory system according to a fourth embodiment.

FIG. 19 corresponds to FIG. 18 in the third embodiment, and illustrates a case where steps ST11B, ST27B, and ST50B to ST56B are executed instead of steps ST11A, ST27A, and ST50A to ST56A illustrated in FIG. 18. Note that, in FIG. 19, as an example, a case is illustrated where steps ST50B to ST56B are executed between steps ST32 and ST34.

As illustrated in FIG. 19, in step ST10, a memory system 1 is powered on.

In step ST11B, the memory system 1 sets a frequency environment of the memory controller 2, a chip A, and a chip B in accordance with a predetermined test case. An arbitrary case can be set as a test case (frequency case) of the frequency environment, and, for example, cases are assumed such as a low frequency case, a normal frequency case, and a high frequency case. For example, when the normal frequency case is set as the frequency case, the frequency environment of the memory system 1 is set to a (default) frequency environment in which the memory system 1 is normally used in an actual operation phase. In addition, for example, when the low frequency case and the high frequency case are set as the frequency cases, the frequency environments of the memory system 1 are set to a lower frequency and a higher frequency than in the normal frequency case, respectively.

In steps ST12 to ST26, the memory system 1 executes the interface training operation, and stores the training result. Note that, in steps ST16 and ST24, in issuance of a training result storing command, the memory controller 2 designates a storage destination of the training result so that the training result is stored to be identifiable for each frequency case. As a result, in steps ST18 and ST26, the chip A and the chip B individually store the training result in a system data region 21B for each frequency case.

In step ST27B, the memory controller 2 determines whether or not the interface training operation has been executed for all the frequency cases. When it is determined that there is a frequency case in which the interface training operation has not been finished (step ST27B; no), the process returns to step ST11B and steps ST11B to ST26 are repeatedly executed. When it is determined that the interface training operation has been finished for all the frequency cases (step ST27B; yes), the process proceeds to step ST28.

In step ST28, power supply to the memory system 1 is stopped, and the test phase is ended.

In step ST30, the memory system 1 is powered on again.

In step ST32, a power-on read process is executed as the power is turned on. In the power-on read process, the training result stored in the system data region 21B in each chip is also read in steps ST18 and ST26, and set in an input control circuit 51, a Ron control circuit 52, an output control circuit 53, and the like. Note that, in the power-on read process, for example, it is assumed that the training result in a default frequency state (that is, the normal frequency case) is read, and set in each circuit.

In step ST50B, the memory controller 2 determines a frequency used for communication with the NAND package 3. Determination of the frequency can be executed not only immediately after power on, but also at an arbitrary timing.

In step ST52B, the memory controller 2 determines whether or not the frequency used for communication with the NAND package 3 has been changed from an immediately preceding (for example, default) setting, based on a determination result of the frequency. When it is determined that the frequency has been changed from the immediately preceding setting (step ST52B; yes), it is determined that a setting change of the training result is necessary, and the process proceeds to step ST54B. On the other hand, when it is determined that the frequency has not been changed from the immediately preceding setting (step ST52B; no), it is determined that the setting change of the training result is unnecessary, and a series of processes is finished.

In step ST54B, the memory controller 2 issues a setting change command for changing a setting of the frequency case in the training result, and sends the command to each chip in the NAND package 3. Note that, the setting change command issued in step ST54B may be a setting change command "ZZh" that is a dedicated command for the interface training operation, or may be a set feature command "EFh" that is a general command used also for another setting change.

In step ST56B, the chip receiving the setting change command performs the setting change of the frequency case in the training result in accordance with the setting change command.

In step ST34, a normal operation is executed including a write operation to a user data region 21A based on the frequency determined to be applied to communication, and a read operation from the user data region 21A.

Thus, a series of processes is finished.

4.2 Advantageous Effects of Present Embodiment

According to the fourth embodiment, in the test phase, the memory system 1 executes interface training operations for mutually different frequency cases, and stores respective results in the system data region 21B in a memory cell array 21. The memory controller 2 determines whether or not the frequency has been changed from the frequency case set immediately before, based on the determination result of the frequency used for communication with the NAND package 3. Then, when the frequency has been changed from the frequency case set immediately before, a setting change command "ZZh" or "EFh" is issued for changing the setting to the training result of an appropriate frequency case. As a result, the memory system 1 can avoid that the parameter set in an input/output circuit 22 is not optimum due to the change in frequency, and adaptively apply an optimum training result depending on the frequency change.

5. Fifth Embodiment

In the second to fourth embodiments, a case has been described where it is determined whether or not to change a training result by monitoring various factors that may cause variation of an optimum setting parameter in communication between a memory controller 2 and a NAND package 3; however, this is not a limitation. For example, the memory controller 2 may change the training result together, in accordance with an instruction for another setting change that may cause variation of the optimum setting parameter, such as a communication mode. In the following, descriptions of a configuration and operation equivalent to those of the third embodiment is omitted, and a configuration and operation different from those of the third embodiment is mainly described.

5.1 Series of Operations Including Interface Training Operation

A series of operations including an interface training operation in a memory system according to a fifth embodiment is described with reference to a flowchart illustrated in FIG. 20.

Figure 20:
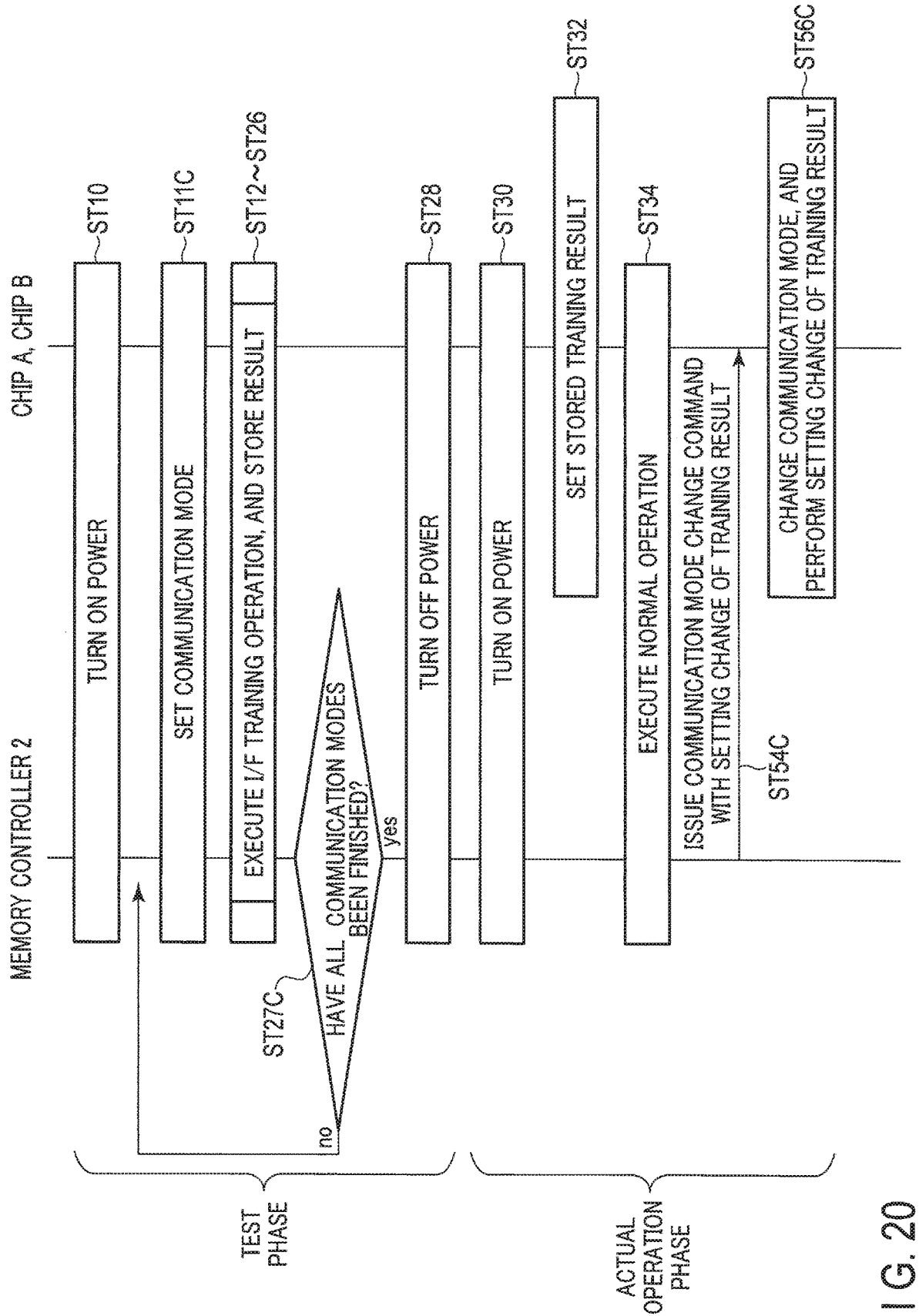
FIG. 20 is a flowchart for explaining a series of operations including an interface training operation in a memory system according to a fifth embodiment.

FIG. 20 corresponds to FIG. 18 in the third embodiment, and illustrates a case where steps ST11C and ST27C are executed instead of steps ST11A and ST27A illustrated in FIG. 18, and steps ST54C and ST56C are executed instead of ST50A to ST56A.

As illustrated in FIG. 20, in step ST10, a memory system 1 is powered on.

In step ST11C, the memory system 1 sets a communication mode of the memory controller 2, a chip A, and a chip B in accordance with a predetermined test case. An arbitrary case can be set as a test case (communication mode case) of the communication mode, and, for example, cases are assumed such as a single data rate (SDR) case, and a double date rate (DDR) case. In addition, as another communication mode case, for example, a case may be further added where a signal RE that is an inverted signal of a signal /RE is further added to the NAND interface in addition to the signal /RE.

In steps ST12 to ST26, the memory system 1 executes the interface training operation, and stores the training result. Note that, in steps ST16 and ST24, in issuance of a training result storing command, the memory controller 2 designates a storage destination of the training result so that the training result is stored to be identifiable for each communication mode. As a result, in steps ST18 and ST26, the chip A and the chip B individually store the training results in a system data region 21B for each communication mode.

In step ST27C, the memory controller 2 determines whether or not the interface training operation has been executed for all the communication modes. When it is determined that there is a communication mode in which the interface training operation has not been finished (step ST27C; no), the process returns to step ST11C and steps ST11C to ST26 are repeatedly executed. When it is determined that the interface training operation has been finished for all the communication modes (step ST27C; yes), the process proceeds to step ST28.

In step ST28, power supply to the memory system 1 is stopped, and the test phase is finished.

In step ST30, the memory system 1 is powered on again.

In step ST32, a power-on read process is executed as the power is turned on. In the power-on read process, the training result stored in the system data region 21B in each chip in steps ST18 and ST26 is also read, and set in an input control circuit 51, a Ron control circuit 52, an output control circuit 53, and the like.

In step ST34, the normal operation is executed including the write operation to the user data region 21A and the read operation from the user data region 21A.

In step ST54C, the memory controller 2 issues a communication mode change command for changing the communication mode, and sends the command to each chip in the NAND package 3. Note that, the communication mode change command also instructs the NAND package 3 to perform the setting change of the training result with the communication mode change. The communication mode change command is, for example, a set feature command "EFh".

In step ST56C, the chip receiving the communication mode change command changes the communication mode and performs the setting change of the training result depending on the communication mode change.

Thus, a series of processes is finished.

5.2 Advantageous Effects of Present Embodiment

According to the fifth embodiment, in the test phase, the memory system 1 executes interface training operations for mutually different communication modes, and stores respective results in the system data region 21B in a memory cell array 21. In an actual operation phase, the memory controller 2 includes an instruction for the setting change of the training result with the communication mode change, in the set feature command "EFh" issued in changing of the communication mode. As a result, the memory system 1 can avoid that the parameter set in an input/output circuit 22 is not optimum due to the change in the communication mode, and adaptively apply an optimum training result depending on the change in the communication mode.

6. Sixth Embodiment

In the second to fifth embodiments, a case has been described where different training results are acquired for respective predetermined test cases in a test phase, and an optimum set value is selected from a plurality of training results acquired; however, this is not a limitation. For example, a training result may be acquired as a reference value, and the reference value may be offset to obtain the optimum set value. In the following, descriptions of a configuration and operation equivalent to those of the second embodiment is omitted, and a configuration and operation different from those of the second embodiment is mainly described.

6.1 Series of Operations Including Interface Training Operation

A series of operations including an interface training operation in a memory system according to a sixth embodiment is described with reference to a flowchart illustrated in FIG. 21.

Figure 21:
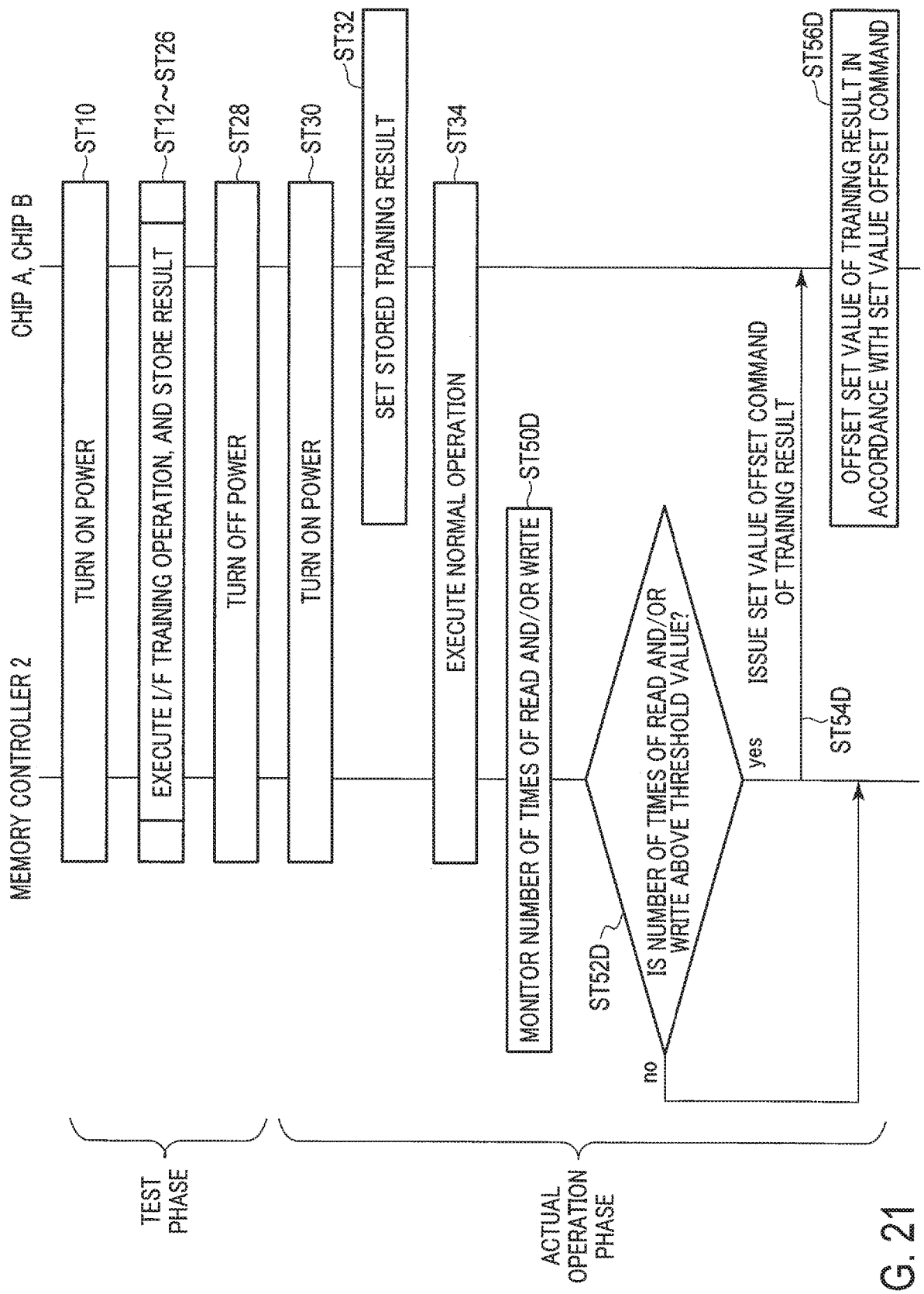
FIG. 21 is a flowchart for explaining a series of operations including an interface training operation in a memory system according to a sixth embodiment.

As illustrated in FIG. 21, in step ST10, a memory system 1 is powered on.

In steps ST12 to ST26, the memory system 1 executes the interface training operation, and stores the training result. As a result, in steps ST18 and ST26, a chip A and a chip B store the training result as the reference value in a system data region 21B.

In step ST28, power supply to the memory system 1 is stopped, and the test phase is ended.

In step ST30, the memory system 1 is powered on again.

In step ST32, a power-on read process is executed as the power is turned on. In the power-on read process, the training result stored in the system data region 21B in each chip in steps ST18 and ST26 is also read, and set in an input control circuit 51, a Ron control circuit 52, an output control circuit 53, and the like. Note that, in the power-on read process, for example, it is assumed that the training result in a default state (that is, in a state in which a set value is not offset with respect to the reference value) is read, and set in each circuit.

In step ST34, the normal operation is executed including the write operation to the user data region 21A and the read operation from the user data region 21A.

In step ST50D, a memory controller 2 monitors the number of times of a read operation and/or a write operation executed in step ST34.

In step ST52D, based on a monitoring result of the number of times of the read operation and/or the write operation, the memory controller 2 determines whether or not the number of times is above a threshold value. When the number of times of the read operation and/or the write operation is above the threshold value (step ST52D; yes), it is determined that a setting change of the training result is necessary, and the process proceeds to step ST54D. On the other hand, when the number of times of the read operation and/or the write operation is below the threshold value (step ST52D; no), it is determined that the setting change of the training result is unnecessary, and a series of processes is finished.

In step ST54D, the memory controller 2 issues a command (set value offset command) for offsetting a set value of the training result from the reference value, and sends the command to a chip determined in step ST52D that the number of times of the read operation and/or the write operation is above the threshold value. Note that, the set value offset command issued in step ST54D may be a setting change command "ZZh" that is a dedicated command for the interface training operation, or may be a set feature command "EFh" that is a general command used also for another setting change.

Specifically, for example, when the setting change command "ZZh" is issued as the set value offset command, it is sufficient that data is sent indicating an offset amount (DAC value) with respect to the reference value, instead of addresses 00h to 02h designating a storage destination of the training result for each case illustrated in FIG. 15 of the second embodiment. In addition, for example, when the set feature command "EFh" is issued as the set value offset command, it is sufficient that the data is sent indicating the offset amount with respect to the reference value, instead of data designating an applied case illustrated in FIG. 16 of the second embodiment.

In step ST56D, the chip receiving the set value offset command offsets the set value of the training result from the reference value in accordance with the set value offset command.

Thus, a series of processes is finished.

6.2 Advantageous Effects of Present Embodiment

According to the sixth embodiment, in the test phase, the memory system 1 executes an interface training operation for determining the reference value, and stores a result in the system data region 21B in a memory cell array 21. The memory controller 2 monitors the number of times of execution of the read operation and the write operation, and determines whether or not the number of times of execution exceeds the threshold value. Then, when the number of times of execution of the read operation and the write operation exceeds the threshold value, the memory controller 2 issues the set value offset command. As a result, a NAND package 3 can set, in an input/output circuit 22, a parameter obtained by considering interface characteristics degradation caused by repeated execution of the read operation and the write operation.

7. Seventh Embodiment

In the first to sixth embodiments, a case has been described where a training result acquired in a test phase is applied in an actual operation phase; however, this is not a limitation. For example, based on the training result acquired in the test phase, a more detailed interface training operation may be executed in the actual operation phase to acquire a training result more suitable for an actual operating environment. In the following, descriptions of a configuration and operation equivalent to those of the first embodiment is omitted, and a configuration and operation different from those of the first embodiment is mainly described.

7.1 Series of Operations Including Interface Training Operation

A series of operations including an interface training operation in a memory system according to a seventh embodiment is described with reference to a flowchart illustrated in FIG. 22.

FIG. 22 corresponds to FIG. 11 in the first embodiment, and illustrates a case where steps ST60 to ST65 are added between steps ST32 and ST34 illustrated in FIG. 11.

As illustrated in FIG. 22, since the operation of steps ST10 to ST32 is equivalent to that in the case of FIG. 11, the description is omitted.

An operation is shifted to the actual operation phase, and the training result of the test phase stored in the interface training operation is set, and then an additional interface training operation (detailed interface training operation) is further executed. The detailed interface training operation is an operation that can accurately acquire a parameter by making a correctable width (resolution) finer than that in the interface training operation in the test phase. When the detailed interface training operation is executed without prior interface training operation in the test phase (in steps ST12 to ST26), the detailed interface training operation requires a longer time than the interface training operation in steps ST12 to ST26. However, by being executed based on the training result of the interface training operation in steps ST12 to ST26, the detailed interface training operation can be executed in a relatively short time.

Specifically, in step ST60, a memory controller 2 determines whether or not to execute the detailed interface training operation. When the detailed interface training operation is executed (step ST60; yes), the process proceeds to step ST61, and when the detailed interface training operation is not executed (step ST60; no), the process proceeds to step ST34.

In step ST61, the memory controller 2 issues a command (detailed I/F training execution command) for executing the detailed interface training operation, and sends the command to a chip A and a chip B. The detailed I/F training execution command is, for example, a dedicated command different from the I/F training execution command issued in the test phase.

Upon receiving the detailed I/F training execution command in step ST62, each of the chip A and the chip B executes the detailed interface training operation, based on the training result set in step ST32.

In step ST63, each of the chip A and the chip B sets a training result (detailed training result) of the detailed interface training operation in an input/output circuit 22.

In step ST64, the memory controller 2 determines whether or not to overwrite the training result stored in a system data region 21B in a NAND package 3 with the detailed training result. When it is determined to overwrite the training result (step ST64; yes), the process proceeds to step ST65, and when it is determined not to overwrite the training result (step ST64; no), the process proceeds to step ST34.

In step ST65, the memory controller 2 issues a training result storing command, and sends the command to the chip A and the chip B.

Upon receiving the training result storing command in step ST66, the chip A and the chip B store the detailed training result of the detailed interface training operation executed in step ST62 in the system data region 21B.

In step ST34, the normal operation is executed including the write operation to the user data region 21A and the read operation from the user data region 21A.

Thus, a series of processes is finished.

7.2 Command Sequence of Interface Training Operation

Figure 23:
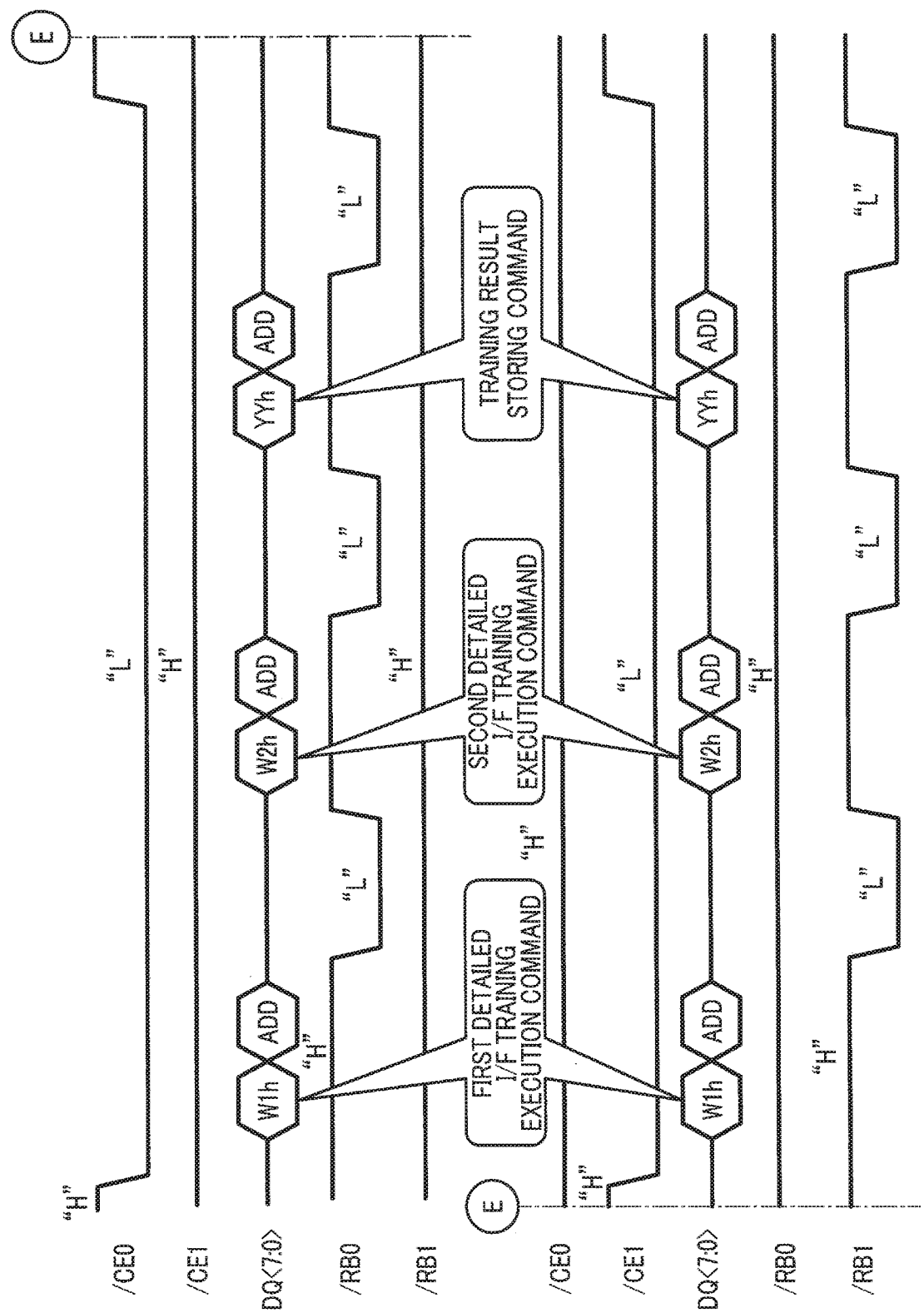
FIG. 23 is a command sequence for explaining the detailed interface training operation in the memory system according to the seventh embodiment.

FIG. 23 is a command sequence for explaining the detailed interface training operation in the memory system according to the seventh embodiment. FIG. 23 corresponds to steps ST61 and ST62 in FIG. 22. FIG. 23 illustrates an example in which two types of detailed interface training are executed for each of the chip A and the chip B.

As illustrated in FIG. 23, commands issued are different between the command sequence of the detailed interface training operation and the command sequence of the interface training operation illustrated in FIG. 12 in the first embodiment.

Specifically, when giving an instruction to execute a detailed interface training operation (first detailed I/F training operation) corresponding to a first type training item, the memory controller 2 issues a command "W1h" instead of a command "X1h". In addition, when giving an instruction to execute a detailed interface training operation (second detailed I/F training operation) corresponding to a second type training item, the memory controller 2 issues a command "W2h" instead of a command "X2h".

By issuing the detailed I/F training execution command different from the I/F training execution command in the test phase as described above, steps ST61 and ST62 in FIG. 22 can be executed.

7.3 Effects of Present Embodiment

According to the seventh embodiment, in the actual operation phase, the memory controller 2 determines whether or not to execute the detailed I/F training operation. As a result, the memory controller 2 can select whether to apply a result of the I/F training operation in the test phase to the normal operation, or to apply a result of the additional detailed I/F training operation to the normal operation. In general, since various operations are executed in the test phase in accordance with the operating environment in the actual operation phase, the result of the I/F training operation in the test phase can be an appropriate set value even in the actual operation phase. However, since the operating environment in the actual operation phase does not completely match the test phase, an optimum set value of the input/output circuit 22 in the actual operation phase may deviate from the training result in the test phase. In the seventh embodiment, by executing the detailed I/F training operation in the actual operation phase, the optimum set value in the actual operating environment can be accurately acquired. Therefore, the deviation of the set value can be corrected caused by the difference in the operating environment between the test phase and the actual operation phase, and the like.

In addition, the detailed I/F training operation is executed based on the training result stored in the system data region 21B in the test phase. As a result, the time required for the detailed I/F training operation can be shortened, and the time required from power on to execution of the normal operation can be shortened.

The memory controller 2 determines whether or not to overwrite the detailed training result by the detailed I/F training operation in the system data region 21B. As a result, it is possible to select whether or not to reuse the detailed training result set in the input/output circuit 22 in step ST64 when power is turned off and then turned on after execution of the detailed training operation. When the detailed training result is not reused, the detailed training result is discarded. Thereafter, when the power is turned off and then turned on, the detailed I/F training operation is executed again. As a result, an optimal detailed training result can be applied each time the power is turned off and then turned on. On the other hand, when the detailed training result is reused, the optimum set value at the time of last power on can be carried over. For this reason, when the set value carried over can continue to be applied at the time of power on this time, execution can be omitted of the detailed I/F training operation. Therefore, depending on the situation, it is possible to suppress the number of times of the interface training operations executed as the power is turned off and then turned on.

8. Others

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A nonvolatile memory comprising:
a memory cell array including a first storage region and a second storage region;
an input/output circuit configured to communicate with a memory controller; and
a control circuit,
wherein the control circuit is configured to:
upon receiving a first command from the memory controller, execute a first training operation related to the input/output circuit, and
upon receiving a second command from the memory controller, store a first result of the first training operation in the first storage region, the second command being a dedicated command for writing data to the first storage region.

2. The memory of claim 1, wherein the control circuit is configured to set the first result stored in the first storage region in the input/output circuit when the first result is stored and then power is turned off and further turned on.

3. The memory of claim 1, wherein after the first result is set in the input/output circuit, the control circuit is configured to:
upon receiving a third command from the memory controller, execute a second training operation related to the input/output circuit, based on the first result, and
change a setting of the input/output circuit from the first result to a second result of the second training operation.

4. The memory of claim 3, wherein after executing the second training operation, the control circuit is configured to:
upon receiving the second command from the memory controller, overwrite the first result on the second result.

5. The memory of claim 1, wherein the first training operation includes de-skewing a signal input to and output from the input/output circuit.

6. The memory of claim 1, wherein the control circuit is configured to:
upon receiving a fourth command including write data from the memory controller, store the write data in the second storage region, and
inhibit the write data to the first storage region by the fourth command.

7. A memory system comprising:
a memory controller; and
a nonvolatile memory including a memory cell array including a first storage region and a second storage region, an input/output circuit configured to communicate with the memory controller, and a control circuit,
wherein the control circuit is configured to:
upon receiving a first command from the memory controller, execute a first training operation related to the input/output circuit, and
upon receiving a second command from the memory controller, store a first result of the first training operation in the first storage region, the second command being a dedicated command for writing data to the first storage region.

8. The system of claim 7, wherein the memory controller is configured to:
issue the first command to the nonvolatile memory in a first state to cause the first training operation to be executed, and then issue the second command to cause the first result in the first state to be stored in the first storage region, and
issue the first command to the nonvolatile memory in a second state to cause the first training operation to be executed, and then issue the second command to cause a third result in the second state to be stored in the first storage region.

9. The system of claim 8, wherein
the nonvolatile memory further includes a temperature sensor, and
the memory controller is configured to issue a fifth command to cause a setting of the input/output circuit to be changed from the first result to the third result when temperature information from the temperature sensor satisfies a first condition.

10. The system of claim 8, wherein
the nonvolatile memory further includes a temperature sensor, and
the control circuit is configured to change a setting of the input/output circuit from the first result to the third result when temperature information from the temperature sensor satisfies a first condition.

11. The system of claim 8, wherein the memory controller is configured to issue a sixth command to cause a setting of the input/output circuit to be changed from the first result to the third result when a voltage supplied to the memory controller satisfies a second condition.

12. The system of claim 8, wherein the memory controller is configured to issue a seventh command to cause a setting of the input/output circuit to be changed from the first result to the third result when a frequency of a signal communicated between the memory controller and the input/output circuit satisfies a third condition.

13. The system of claim 8, wherein the memory controller is configured to issue an eighth command to change a communication mode between the memory controller and the input/output circuit, and to cause a setting of the input/output circuit to be changed from the first result to the third result.

14. The system of claim 7, wherein the memory controller is configured to:
issue a ninth command to cause a setting of the input/output circuit to be offset from the first result when a fourth condition is satisfied.

15. The system of claim 14, wherein the memory controller is configured to:
count a first number of times of reading data from the second storage region or a second number of times of writing data to the second storage region, and
issue the ninth command to cause the setting of the input/output circuit to be offset from the first result when the first number of times or the second number of times satisfies the fourth condition.

16. The system of claim 7, wherein the first training operation includes de-skewing a signal input to and output from the input/output circuit.

17. The system of claim 7, wherein the control circuit is configured to:
upon receiving a fourth command including write data from the memory controller, store the write data in the second storage region, and
inhibit the write data to the first storage region by the fourth command.

18. A nonvolatile memory comprising:
a memory cell array including a first storage region and a second storage region;
an input/output circuit configured to communicate with a memory controller; and
a control circuit,
wherein the control circuit is configured to:
upon receiving a first command from the memory controller, execute a first training operation related to the input/output circuit,
upon receiving a second command from the memory controller, store a first result of the first training operation in the first storage region, and
set the first result stored in the first storage region in the input/output circuit when the first result is stored and then power is turned off and further turned on.

19. A nonvolatile memory comprising:
a memory cell array including a first storage region and a second storage region;
an input/output circuit configured to communicate with a memory controller; and
a control circuit,
wherein the control circuit is configured to:
upon receiving a first command from the memory controller, execute a first training operation related to the input/output circuit, and
upon receiving a second command from the memory controller, store a first result of the first training operation in the first storage region, and
wherein after the first result is set in the input/output circuit, the control circuit is configured to:
upon receiving a third command from the memory controller, execute a second training operation related to the input/output circuit, based on the first result, and
change a setting of the input/output circuit from the first result to a second result of the second training operation.

* * * * *